US010715195B2

(12) United States Patent
Miller et al.

(10) Patent No.: US 10,715,195 B2
(45) Date of Patent: Jul. 14, 2020

(54) SPLIT MIXER CURRENT CONVEYER

(71) Applicant: Futurewei Technologies, Inc., Plano, TX (US)

(72) Inventors: Matthew Richard Miller, Arlington Heights, IL (US); Brian Creed, Batavia, IL (US); Terrie McCain, Round Lake, IL (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 16/007,711

(22) Filed: Jun. 13, 2018

(65) Prior Publication Data

US 2019/0386694 A1 Dec. 19, 2019

(51) Int. Cl.
| | |
|---|---|
| *H04B 1/16* | (2006.01) |
| *H03D 7/12* | (2006.01) |
| *H03F 3/45* | (2006.01) |

(52) U.S. Cl.
CPC ............... *H04B 1/16* (2013.01); *H03D 7/125* (2013.01); *H03F 3/45179* (2013.01); *H03F 2200/451* (2013.01)

(58) Field of Classification Search
CPC . H04B 1/16; H03F 3/45179; H03F 2200/451; H03D 7/125; H03D 7/163; H03D 7/165; H03D 2200/0082

(Continued)

(56) References Cited

U.S. PATENT DOCUMENTS 6,037,825 A * 3/2000 Kung ................... H03D 7/1433
327/356
8,761,707 B1 6/2014 Connell et al.
(Continued)

FOREIGN PATENT DOCUMENTS

| CN | 105340185 A | 2/2016 |
| CN | 107104687 A | 8/2017 |
| CN | 207304487 U | 5/2018 |

OTHER PUBLICATIONS

Mirzaei, Ahmad, et al., "Analysis and Optimization of Current-Driven Passive Mixers in Narrowband Direct-Conversion Receivers," IEEE Journal of Solid-State Circuits, vol. 44, No. 10, Oct. 2009, 11 pages.

(Continued)

*Primary Examiner* — Fitwi Y Hailegiorgis
(74) *Attorney, Agent, or Firm* — Vierra Magen Marcus LLP

(57) ABSTRACT

The disclosure relates to technology for an apparatus having a current conveyer comprising a first stage having a first differential input, and a second stage having a second differential input. The first and second stages are configured to operate in a push-pull mode to provide an output signal at a current conveyer output between the first stage and the second stage. The apparatus has a first frequency mixer configured to generate a first mixer signal based on an input signal and an oscillator signal having a first frequency. The first frequency mixer is configured to provide the first mixer signal to the first differential input. The apparatus has a second frequency mixer configured to generate a second mixer signal based on the input signal and a second oscillator signal having the first frequency. The second frequency mixer is configured to provide the second mixer signal to the second differential input.

20 Claims, 14 Drawing Sheets

(58) Field of Classification Search
USPC .......................... 375/316; 330/253; 327/356
See application file for complete search history.

(56) References Cited

U.S. PATENT DOCUMENTS

| | | | |
|---|---|---|---|
| 8,928,407 | B2 | 1/2015 | Miller et al. |
| 2002/0079930 | A1 | 6/2002 | Wei et al. |
| 2004/0090272 | A1* | 5/2004 | Sibrai .................. H03F 3/3028 330/288 |
| 2009/0279642 | A1 | 11/2009 | Zarei |
| 2010/0128820 | A1 | 5/2010 | Ko |
| 2010/0167681 | A1 | 7/2010 | Chien et al. |
| 2014/0022015 | A1* | 1/2014 | Werking ............. H03F 3/45183 330/253 |
| 2014/0253233 | A1 | 9/2014 | Miller et al. |

OTHER PUBLICATIONS

International Search Report dated Aug. 27, 2019, in PCT Patent Application No. PCT/CN2019/091017, 10 pages.

* cited by examiner

SPLIT MIXER CURRENT CONVEYER

FIELD

The disclosure generally relates to electronic circuits and methods, and in particular to split mixer current conveyor circuits and related methods.

BACKGROUND

A current conveyor is an electronic amplifier that is used to transfer a current from a first circuit to a second circuit. The current conveyer prevents the second circuit from undesirably loading the first circuit's output current, and thereby interfering with operation of the first circuit. The current conveyer may have a unity current gain, in which case the current conveyer does not alter the magnitude of the current it passes. An ideal current conveyer has an infinite output impedance and zero input impedance. Of course, an ideal current conveyer cannot be realized with real world physical components. However, a high output impedance and a low input impedance can be realized in a current conveyer. A current conveyer with a resistive load at its output is referred to herein as a trans-impedance amplifier. A trans-impedance amplifier (TIA) is an amplifier that receives a current and outputs a voltage. In other words, a TIA is a current to voltage converter.

Current conveyers have a wide variety of uses, one of which is in a radio frequency (RF) transceiver. A direct conversion receiver (DCR) may be used in an RF transceiver to receive an RF signal. The DCR demodulates an incoming radio signal using synchronous detection driven by a local oscillator whose frequency is very close or equal to the carrier frequency of the intended signal. In a DCR, the RF is fed into a frequency mixer, and the frequency of a local oscillator is near the received signal's frequency, resulting in a demodulated output. A DCR may include one or more current conveyors.

SUMMARY

According to one aspect of the present disclosure, there is provided an apparatus that includes a current conveyer comprising a first stage having a first differential input, a second stage having a second differential input, and a current conveyer output between the first stage and the second stage. The first stage and the second stage are configured to operate in a push-pull mode to provide an output signal at the current conveyer output. The apparatus further comprises a first frequency mixer coupled to the current conveyer. The first frequency mixer is configured to generate a first mixer signal based on an input signal and a first oscillator signal having a first frequency. The first frequency mixer is configured to provide the first mixer signal to the first differential input. The apparatus further comprises a second frequency mixer coupled to the current conveyer. The second frequency mixer is configured to generate a second mixer signal based on the input signal and a second oscillator signal also having the first frequency. The second frequency mixer is configured to provide the second mixer signal to the second differential input.

Optionally, in the preceding aspect, first stage comprises a first common gate/base differential amplifier comprising the first differential input and a first differential output connected to the current conveyer output. The second stage comprises a second common gate/base differential amplifier comprising the second differential input and a second differential output connected to the current conveyer output.

Optionally, in any of the preceding aspects, the first common gate/base differential amplifier comprises a pair of PMOS transistors each having a gate and a source. The pair of PMOS transistors have their gates connected together. The second common gate/base differential amplifier comprises a pair of NMOS transistors each having a gate and a source. The pair of NMOS transistors having their gates connected together.

Optionally, in any of the preceding aspects, the source of a first member of the pair of PMOS transistors is a positive input of the first differential input, the source of a second member of the pair of PMOS transistors is a negative input of the first differential input, the source of a first member of the pair of NMOS transistors is a positive input of the second differential input, and the source of a second member of the pair of NMOS transistors is a negative input of the second differential input.

Optionally, in any of the preceding aspects, the first common gate/base differential amplifier comprises a pair of PNP transistors each having a base. The pair of PNP transistors have their bases connected together. The second common gate/base differential amplifier comprises a pair of NPN transistors each having a base. The pair of NPN transistors have their bases connected together.

Optionally, in any of the preceding aspects, the apparatus further comprises a common mode voltage control circuit coupled to the current conveyer output and to the first common gate/base differential amplifier. The common mode voltage control circuit is configured to control a common mode voltage at the current conveyer output.

Optionally, in any of the preceding aspects, the first frequency mixer is a first down-mixer, and the second frequency mixer a second down-mixer.

Optionally, in any of the preceding aspects, the first frequency mixer comprises a first input terminal and a second input terminal, and the second frequency mixer comprises a third input terminal and a fourth input terminal. The apparatus further comprises a first signal coupling capacitor connected to the first input terminal, and a second signal coupling capacitor connected to the second input terminal. The first and second signal coupling capacitors are configured to couple the input signal to the first frequency mixer. The apparatus further comprises a third signal coupling capacitor connected to the third input terminal, and a fourth signal coupling capacitor connected to the fourth input terminal. The third and fourth signal coupling capacitors are configured to couple the input signal to the second frequency mixer.

Optionally, in any of the preceding aspects, the first and the second stage form a class AB amplifier.

Optionally, in any of the preceding aspects, the apparatus further comprises a component configured to provide the input signal to the first frequency mixer and to the second frequency mixer, the input signal being a radio frequency (RF) signal. The apparatus further comprises a low pass filter coupled to the current conveyer output, the current conveyer configured to provide the output signal to the low pass filter.

Optionally, in any of the preceding aspects, the first oscillator signal and the second oscillator signal have the same phase.

According to another aspect of the present disclosure, there is provided a method of processing an input signal. The method comprises providing a first oscillator signal having a first frequency to a first frequency mixer; and providing a second oscillator signal having a second frequency to a second frequency mixer, wherein the second frequency being the same frequency as the first frequency. The method further comprises generating a first mixer output signal based on the input signal and the first oscillator signal; generating a second mixer output signal based on the input signal and the second oscillator signal; providing the first mixer output signal to a first differential input of a first stage of a current conveyer; providing the second mixer output signal to a second differential input of a second stage of the current conveyer; and operating the first stage and the second stage of the current conveyer in a push-pull mode to generate an output signal from a current conveyer output of the current conveyer.

Optionally, in any of the preceding aspects, operating the first stage and the second stage of the current conveyer in the push-pull mode to generate the output signal from the current conveyer comprises operating the first stage and the second stage as a class AB amplifier.

Optionally, in any of the preceding aspects, operating the first stage and the second stage of the current conveyer in the push-pull mode to generate the output signal from the current conveyer comprises the first stage providing a first current to the current conveyer output for more than 180 degrees but less than 360 degrees of the output signal; and the second stage sinking a second current from the current conveyer output for more than 180 degrees but less than 360 degrees of the output signal.

Optionally, in any of the preceding aspects, generating the first mixer output signal based on the input signal and the first oscillator signal comprises generating a first baseband signal based on a radio frequency (RF) signal; and generating the second mixer output signal based on the input signal and the second oscillator signal comprises generating a second baseband signal based on the radio frequency (RF) signal.

According to another aspect of the present disclosure, there is provided a radio frequency (RF) receiver, comprising: a current conveyer comprising a first pair of transistors having a first polarity and each having a control terminal, an input terminal, and an output terminal. The control terminals of the first pair of transistors are connected to each other. The current conveyer further comprises a second pair of transistors having a second polarity opposite the first polarity. The second pair of transistors each have a control terminal, an input terminal, and an output terminal. The control terminals of the second pair of transistors being connected to each other. The first and second pairs of transistors configured such that: the output terminals of a first member of the first pair of transistors and a first member of the second pair of transistors are coupled together, and the output terminals of a second member of the first pair of transistors and a second member of the second pair of transistors are coupled together. The RF receiver further comprises a first down-mixer having a first radio frequency signal input, a first oscillator signal input, and a first baseband signal output. The first baseband signal output is connected between the input terminals of the first pair of transistors. The RF receiver further comprises a second down-mixer having a second radio frequency signal input, a second oscillator signal input, and a second baseband signal output. The second baseband signal output is connected between the input terminals of the second pair of transistors. The RF receiver further comprises a radio frequency signal circuit configured to provide the same radio frequency signal to the first radio frequency signal input and to the second radio frequency signal input. The RF receiver further comprises circuitry configured to provide a first oscillator signal having a first frequency to the first oscillator signal input and a second oscillator signal having a second frequency that is the same frequency as the first frequency to the second oscillator signal input. The first oscillator signal and the second oscillator signal have the same phase. The RF receiver further comprises a current conveyer differential output configured to output a current. The current conveyer differential output has a first node coupled to the output terminals of the first members of the first and second pairs of transistors. The current conveyer differential output has a second node coupled to the output terminals of the second members of the first and second pairs of transistors.

Optionally, in any of the preceding aspects, the RF receiver further comprises a pair of cascode transistors, wherein a first member of the pair of cascode transistors is coupled between the output terminal of the first member of the first pair of transistors having the first polarity and the output terminal of the first member of the second pair of transistors having the second polarity, wherein a second member of the pair of cascode transistors is coupled between the output terminal of the second member of the first pair of transistors having the first polarity and the output terminal of the second member of the second pair of transistors having the second polarity.

Optionally, in any of the preceding aspects, the first pair of transistors are PMOS transistors, the second pair of transistors are NMOS transistors, and the pair of cascode transistors are PMOS transistors.

Optionally, in any of the preceding aspects the first pair of transistors are PMOS transistors, the second pair of transistors are NMOS transistors, and the pair of cascode transistors are NMOS transistors.

Optionally, in any of the preceding aspects the pair of cascode transistors are a first pair of cascode transistors. The RF receiver further comprises a second pair of cascode transistors, wherein a first member of the second pair of cascode transistors is coupled between the first member of the first pair of cascode transistors and the output terminal of the first member of the second pair of transistors having the second polarity, wherein a second member of the second pair of cascode transistors is coupled between the second member of the first pair of cascode transistors and the output terminal of the second member of the second pair of transistors having the second polarity.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

BRIEF DESCRIPTION OF THE DRAWINGS

Aspects of the present disclosure are illustrated by way of example and are not limited by the accompanying figures for which like references indicate elements.

DETAILED DESCRIPTION

Figure 1:
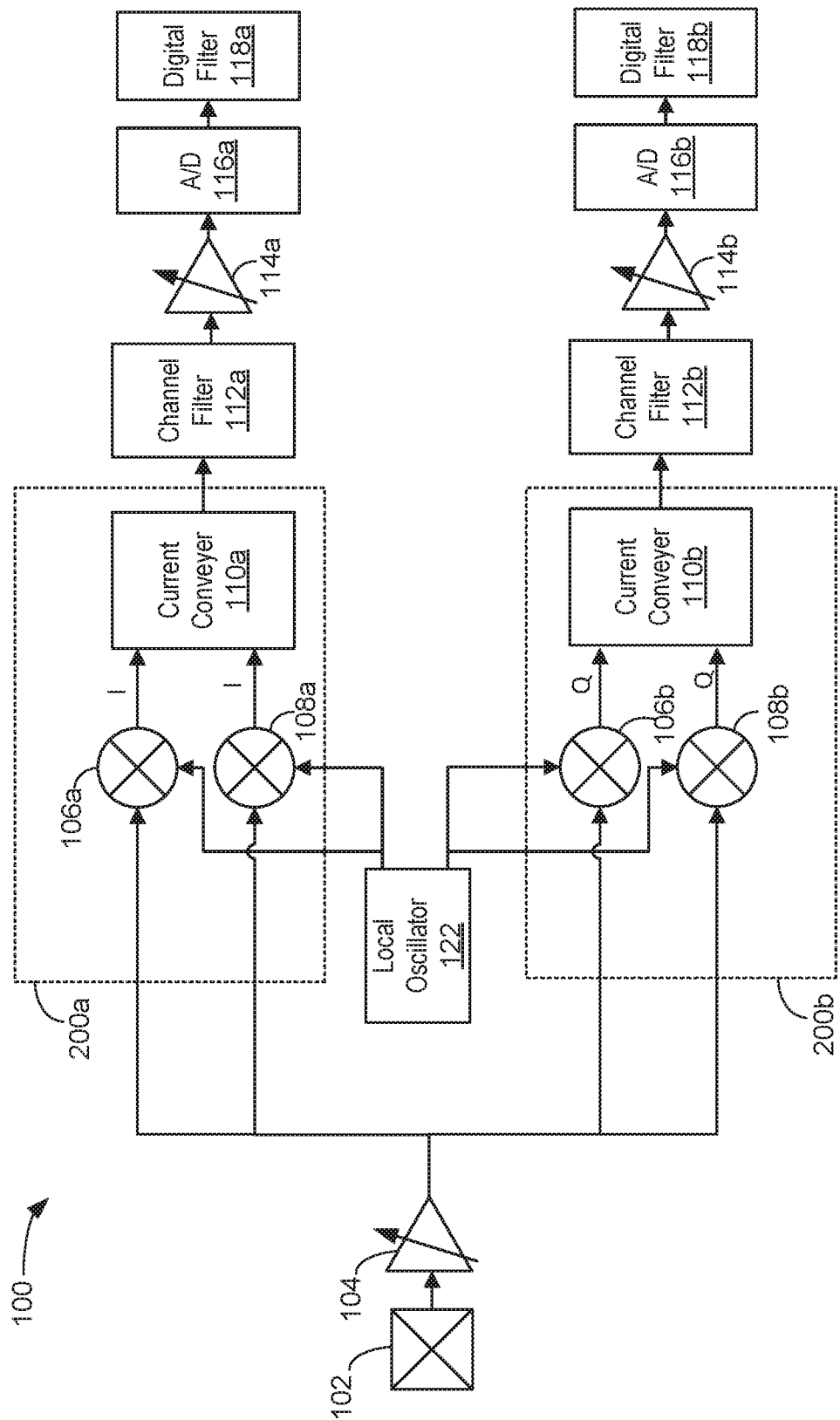
FIG. 1 is a block diagram of an embodiment of a direct conversion receiver (DCR).

The present disclosure will now be described with reference to the figures, which in general relate to a circuit having a current conveyer, as well as methods of operating the circuit. In one embodiment, the circuit is used in a direct conversion receiver. One embodiment of the circuit has two frequency mixers and a current conveyer with two differential inputs. The two frequency mixers process the same input signal (which may be an RF signal). The two frequency mixers also receive the same frequency oscillator signal. For example, the same local oscillator signal may be used as the oscillator input for both frequency mixers. The output signals from the two frequency mixers are input to the respective differential inputs of the current conveyer. The two frequency mixers are down-mixers, in one embodiment.

The current conveyer in embodiments of a circuit having a current conveyer with a pair of frequency mixers has a low input impedance and a high output impedance. The current conveyer passes a current from the pair of frequency mixers to a downstream circuit, in one embodiment. An example of the downstream circuit is a channel filter. The current conveyer prevents the downstream circuit from undesirably loading the frequency mixers, and thereby interfering with operation of the frequency mixers.

An embodiment of a current conveyer has good linearity over a wide range of frequencies. Note that some current conveyers may be used in a system that simultaneously processes a desired signal at one frequency and an undesired signal at a different frequency. For example, a direct conversion receiver may process a desired signal at one frequency and a blocking signal at another frequency. Moreover, the desired signal may have a much smaller magnitude than the undesired (e.g., blocking) signal. In some conventional current conveyers, the gain of the desired signal is reduced when the current conveyer is simultaneously processing a desired signal and a blocking signal having a larger amplitude than the desired signal. The current conveyer in embodiments of a circuit having a current conveyer with a pair of frequency mixers is able to simultaneously process a desired signal and a blocking signal having a larger amplitude than the desired signal without significant reduction of the gain of the desired signal.

An embodiment of a circuit having a current conveyer and a pair of frequency mixers has low power dissipation. The current conveyer may have a small bias current when the signal it is processing is small. For example, if there is no blocking signal, or the blocking signal has a small magnitude, the current conveyer can operate effectively with a small bias current. Hence, power is saved. When the signal being processed by the current conveyer is larger, the current conveyer can automatically increase its bias current such that the larger signal can be processed without distortion or without attenuation of the desired signal. For example, if there is blocking signal with a larger magnitude than the desired signal, the current conveyer can increase the bias current (relative to there being no or a smaller blocking signal). In one embodiment, the current conveyer includes a class AB amplifier, which provides for efficient operation and low power dissipation.

An embodiment of a circuit having a current conveyer and a pair of frequency mixers uses a small die area. Each pair of frequency mixers has two signal coupling capacitors at its signal input, in one embodiment. The signal coupling capacitors may be used to couple an RF signal to the input of a frequency mixer. The signal coupling capacitors are on the high frequency side of the frequency mixer, in one embodiment, which allows them to be smaller than if the signal coupling capacitors were on the low frequency side of the frequency mixer. Having smaller signal coupling capacitors can save die area.

It is understood that the present embodiments of the disclosure may be implemented in many different forms and that claims scopes should not be construed as being limited to the embodiments set forth herein. Rather, these embodiments are provided so that this disclosure will be thorough and complete and will fully convey the inventive embodiment concepts to those skilled in the art. Indeed, the disclosure is intended to cover alternatives, modifications and equivalents of these embodiments, which are included within the scope and spirit of the disclosure as defined by the appended claims. Furthermore, in the following detailed description of the present embodiments of the disclosure, numerous specific details are set forth in order to provide a thorough understanding. However, it will be clear to those of ordinary skill in the art that the present embodiments of the disclosure may be practiced without such specific details.

FIG. 1 illustrates a block diagram of one embodiment of a direct conversion receiver (DCR) 100. The DCR 100 may also be referred to as a homodyne receiver or a zero-IF (Intermediate Frequency) receiver. The DCR 100 includes two split-mixer current conveyer (SMCC) circuits 200a, 200b, which each have a current conveyer 110a, 110b. SMCC circuit 200a has current conveyer 110a and two frequency mixers 106a, 108a. SMCC circuit 200b has current conveyer 110b and two frequency mixers 106b, 108b. The current conveyers 110a, 110b are able to simultaneously process a desired signal and a blocking signal having a larger amplitude than the desired signal without significant reduction of the gain of the desired signal. SMCC circuits 200a, 200b each occupy a small die area, in one embodiment. SMCC circuits 200a, 200b have a low power dissipation, in one embodiment.

The DCR 100 demodulates an incoming radio frequency (RF) signal using synchronous detection driven by a local oscillator 122. The frequency of the local oscillator 122 may be very close to or equal to the carrier frequency of the desired signal. Note that because the frequency of the local oscillator 122 may be at or very close to the carrier frequency of the desired signal, noise from the local oscillator 122 may be injected into the RF signal processing. Embodiments of SMCC circuit 200a, 200b are able to pass the desired signal without attenuation, despite such noise. The local oscillator 122 is one example of circuitry configured to provide oscillator signals. Note that the local oscillator 122 provides multiple oscillator signals each having the same frequency, in one embodiment. As will be described more fully below, the various oscillator signals are provided to the frequency mixers 106a, 106b, 108a, 108b.

Radio frequency (RF) input 102 is configured to receive an RF input signal. In one embodiment, RF input 102 includes an input pin on an integrated circuit (IC). The RF input signal may be at a frequency of about 2 GHz, as one example. However, the RF signal frequency may be higher or lower than 2 GHz. Also, the RF input signal may contain an in-phase (I) component and a quadrature (Q) component. Additionally, RF input 102 is coupled to low noise amplifier (LNA) 104. The LNA 104 is a variable gain amplifier, in one embodiment. The frequency mixers 106a, 108a, 106b, and 108b separate the I component and the Q component of the RF input signal. The I component and Q component are processed separately by similar components.

The RF output of the LNA (104) is provided to SMCC circuit 200a, and SMCC circuit 200b. SMCC circuit 200a includes two frequency mixers 106a, 108a, as well as a current conveyer 110a, as noted above. SMCC circuit 200b includes two frequency mixers 106b, 108b as well as a current conveyer 110b, as noted above. The frequency mixers 106a, 106b, 108a, 108b are down-mixers in the embodiment of FIG. 1. Local Oscillator (122) provides multiple oscillator signals each having the same frequency. The oscillator signals provided to frequency mixers 106a and 108a are 90 degrees out of phase with the oscillator signals provided to frequency mixers 106b and 108b. In this way, the RF signal is separated into I and Q components. Note that herein, the reference number 200 may be used to refer to either SMCC circuit 200a or 200b. Also, the SMCC circuit 200 is not limited to processing an I component or a Q component of an RF signal.

Processing of the I component signal will now be discussed. Note that processing of the Q component signal is similar and will be briefly discussed below. Each frequency mixer 106a and 108a in SMCC circuit 200a inputs the input RF signal. Thus, frequency mixer 106a and 108a in SMCC circuit 200a each process the same input signal. Local oscillator 122 provides an oscillator signal to each frequency mixer 106a and 108a in SMCC circuit 200a. These two oscillator signals have the same frequency. These two oscillator signals that are provided to frequency mixer 106a and 108a have the same frequency and the same phase, in one embodiment.

Each frequency mixer 106a, 108a is a down-mixer, in one embodiment, which is configured to convert a relatively high frequency input RF signal to a baseband signal. Frequency mixer 106a and 108a each convert the I component of the input RF signal to a baseband signal. For example, the baseband signal could have a frequency range from about 180 kHz to about 20 MHz. The frequency mixers 106a and 108a in SMCC circuit 200a are highly linear passive switching low impedance mixers, in one embodiment.

SMCC circuit 200a also has a current conveyer 110a. Current conveyor 110a is coupled to channel filter 112a. The current conveyer 110a is an electronic amplifier with unity gain, in one embodiment. The current conveyer 110a has two inputs and one output. The two inputs are each a differential input, in one embodiment. The output is a differential output, in one embodiment. Each input of the current conveyer 110a receives the output of one of the frequency mixers 106a, or 108a. FIGS. 2, 3, 4, 5, 6A, 6B, and 8 show several embodiments that may be used to implement SMCC circuit 200a or 200b.

The channel filter 112a may be a low pass filter (LPF) that attenuates frequencies above a given frequency. Channel filter 112a is coupled to variable gain amplifier 114a. Variable gain amplifier (VGA) 114a is coupled to analog-to-digital converter (A/D) 116a. A/D 116a is coupled to digital filter 118a. In an example, digital filter 118a is implemented in a digital signal processor (DSP).

The Q component of the RF signal may be processed in similar manner as the I component of the RF signal. The Q component is produced by SMCC circuit 200b, which may operate in a similar manner as SMCC circuit 200a. The Q component is processed by channel filter 112b, variable gain amplifier 114b, A/D 116b and digital filter 118b.

In one embodiment, LNA 104, local oscillator 122, frequency mixers 106a, 106b, 108a, 108b current conveyors 110a, 110a, channel filters 112a, 112b, and variable gain amplifiers 114a, 114b are integrated on a single integrated circuit. However, it is not required that LNA 104, local oscillator 122, frequency mixers 106a, 106b, 108a, 108b, current conveyors 110a, 110a, channel filters 112a, 112b, and variable gain amplifiers 114a, 114b all be on the same integrated circuit. In one embodiment, local oscillator 122 is on a different integrated circuit from SMCC circuits 200a, 200b. In one embodiment, an oscillator signal from the local oscillator 122 is provided to an integrated circuit having SMCC circuits 200a and 200b. The integrated circuit containing SMCC circuits 200a and 200b has circuitry configured to provide (or route) the input oscillator signal to each of the frequency mixers 106a, 106b, 108a, 108b in one embodiment.

Note that the DCR 100 in FIG. 1 has a single frequency mixing step per channel. One embodiment of an SMCC circuit 200 may also be used in other types of radio receivers including, but not limited to, those with more than a single frequency mixing step per channel. For example, a superheterodyne receiver may have a frequency mixer that changes the incoming radio signal to an intermediate frequency (which may be higher or lower than the frequency of the incoming radio signal). After processing the intermediate frequency signal, the superheterodyne receiver may have a frequency mixer that converts the processed intermediate frequency signal to a baseband signal.

Figure 2:
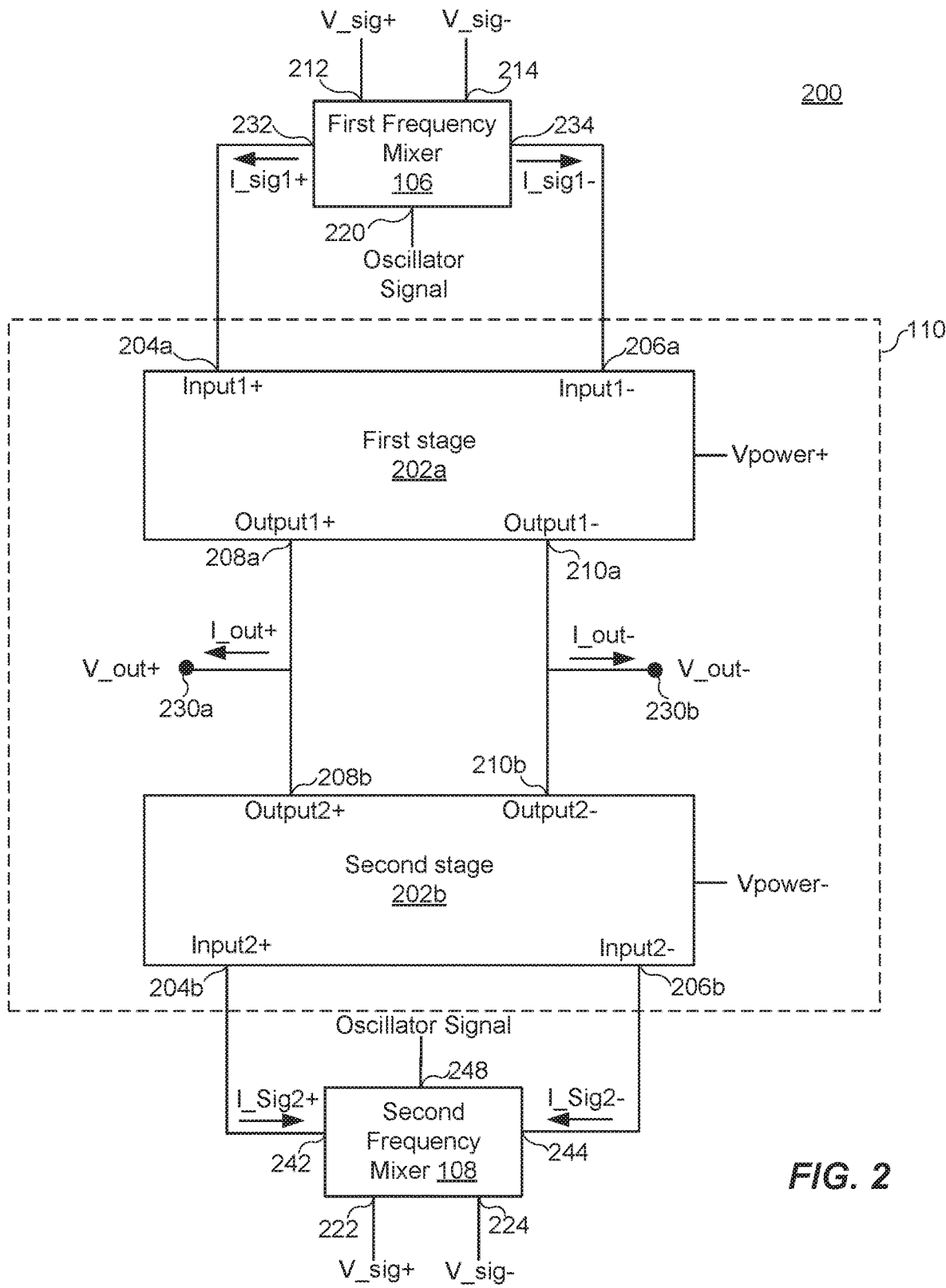
FIG. 2 is a block level diagram of one embodiment of a split-mixer current conveyer (SMCC) circuit having a current conveyer and a pair of frequency mixers.

FIG. 2 is a block level diagram of one embodiment of an SMCC circuit 200 having a current conveyer 110 and a pair of frequency mixers 106, 108. The SMCC circuit 200 could be used for either SMCC circuit 200a or 200b in the DCR 100 in FIG. 1. Note that the current conveyer 110 could be used for either current conveyer 110a or 110b in the DCR 100 of FIG. 1. Also note that the reference numeral 110 is used herein for the current conveyer 110 when not specifically referring to either current conveyer 110a or 110b. The SMCC circuit 200 of FIG. 2 is not limited to use in the DCR 100 in FIG. 1. Also, the SMCC circuit 200 of FIG. 2 is not limited to use in a DCR. For example, SMCC circuit 200 could also be used in a superheterodyne receiver.

The current conveyer 110 has a first stage 202a and a second stage 202b. Note that first stage 202a may also be referred to as first differential stage 202a, and second stage 202b may also be referred to as second differential stage 202b. The first stage 202a has positive input terminal (Input1+) 204a, and negative input terminal (Input1−) 206a.

Together, input terminals 204a, 206a form a differential input of first stage 202a, in one embodiment. The first stage 202a has positive output terminal (Output1+) 208a and negative output terminal (Output1−) 210a. Together, the output terminals 208a, 210a form a differential output of first stage 202a, in one embodiment. The second stage 202b has positive input terminal (Input2+) 204b, and negative input terminal (Input2−) 206b. Together, input terminals 204b, 206b form a differential input of second stage 202b, in one embodiment. The second stage 202b has positive output terminal (Output2+) 208b, and negative output terminal (Output2−) 210b. Together, the output terminals 208b, 210b form a differential output of second stage 202b, in one embodiment.

In one embodiment, the first stage 202a includes a first common gate differential amplifier and the second stage 202b includes a second common gate differential amplifier. A common gate differential amplifier may contain metal oxide semiconductor field effect transistors (MOSFETs). The transistors in the first common gate differential amplifier have the opposite polarity as the transistors in the second common gate differential amplifier. For example, the transistors in the first common gate differential amplifier are NMOS and the transistors in the second common gate differential amplifier are PMOS, in one embodiment. The transistors in the first common gate differential amplifier are PMOS and the transistors in the second common gate differential amplifier are NMOS, in another embodiment. Note that the polarity of the voltages (Vpower+ and Vpower−) may be reversed in the event that the first common gate differential amplifier are PMOS and the transistors in the second common gate differential amplifier are NMOS. Several embodiments in which the first and second stages 202a, 202b include first and second common gate differential amplifiers are shown and described with respect to FIGS. 3, 4, 5, 6A, 6B, and 8.

In one embodiment, the first stage 202a includes a first common base differential amplifier and the second stage 202b includes a second common base differential amplifier. A common base differential amplifier contains bipolar junction transistors (BJTs). The BJT transistors in the first common base differential amplifier have the opposite polarity as the BJT transistors in the second common base differential amplifier. For example, the BJT transistors in the first common base differential amplifier are PNP and the BJT transistors in the second common base differential amplifier are NPN, in one embodiment. The BJT transistors in the first common base differential amplifier are NPN and the BJT transistors in the second common base differential amplifier are PNP, in another embodiment.

Herein, the term "common gate/base differential amplifier" means that the differential amplifier in a given stage 202a or 202b is either a common gate differential amplifier or, alternatively, a common base differential amplifier. In one embodiment, the first and second stages 202a, 202b are both common gate or both common base. For example, either the first stage 202a includes a first common gate differential amplifier and the second stage 202b includes a second common gate differential amplifier or, alternatively, the first stage 202a includes a first common base differential amplifier and the second stage 202b includes a second common base differential amplifier. In one embodiment, one of the stages is common gate and the other stage is common base. For example, the first stage 202a might include a common gate differential amplifier and the second stage 202b might include a common base differential amplifier or, alternatively, the first stage 202a might include a common base differential amplifier and the second stage 202b might include a common gate differential amplifier. Moreover, the transistors in the first common gate/base differential amplifier are of the opposite polarity as the transistors in the second common gate/base differential amplifier (e.g., NMOS versus PMOS, or NPN versus PNP). Note that the gate of an MOS transistor and the base of a BJT transistor are both examples of "control terminals." In other words, the term "control terminal" is used herein to refer to either a gate of an MOS transistor or a base of a BJT transistor.

The current conveyer 110 has current conveyer positive output terminal 230a, as well as current conveyer negative output terminal 230b. Together, the current conveyer output terminals 230a, 230b form a differential output of the current conveyer, in one embodiment. Current conveyer positive output terminal 230a provides V_out+, whereas current conveyer negative output terminal 230b provides V_out−. A current converter output current I_out+ is labeled at positive output terminal 230a. A current converter output current I_out− is labeled at negative output terminal 230b. In an embodiment in which the SMCC circuit 200 is used in DCR 100, current conveyer output terminals 230a, 230b are connected to channel filter 112. Note that reference numeral 112 may be used to refer to either channel filter 112a or 112b. Note that if there is a resistive load between current conveyer output terminals 230a, 230b, then the current conveyer 110 may be referred to as a TIA. As noted herein, a TIA is an amplifier that receives a current (e.g., I_sig) and outputs a voltage (e.g., V_out). Note that the input impedance of the component connected to the current conveyer output terminals 230a, 230b may be considered to be a resistive load. For example, in an embodiment in which the SMCC circuit 200 is used in DCR 100, the input impedance of channel filter 112 may be considered to be a resistive load at the current conveyer output terminals 230a, 230b.

Note that in one embodiment, the positive output terminal 208a of the first stage 202a, the positive output terminal 208b of the second stage 202b, and the current conveyer positive output terminal 230a are at the same node. Likewise, in one embodiment, the negative output terminal 210a of the first stage 202a, the negative output terminal 210b of the second stage 202b, and the current conveyer negative output terminal 230b are at the same node. Note that V_out+ is equal to the voltage at the positive output terminal 208a of the first stage 202a, as well as equal to the voltage at the positive output terminal 208b of the second stage 202b, in one embodiment. Likewise, V_out− is equal to the voltage at the negative output terminal 210a of the first stage 202a, as well as equal to the voltage at the negative output terminal 210b of the second stage 202b, in one embodiment.

The first differential stage 202a may be connected to a positive power supply (Vpower+), in the case of PMOS or PNP transistors. The second differential stage 202b may be connected to a negative power supply (Vpower−), in the case of NMOS or NPN transistors. The negative power supply could be ground.

The first frequency mixer 106 has input terminals 212, 214, which are configured to receive an input signal, and to provide the input signal to electrical components within the first frequency mixer 106. Together input terminals 212 and 214 receive an input signal (V_sig). The input signal could be an RF signal. Input terminal 212 receives V_sig+, whereas input terminal 214 receives V_sig−. In an embodiment in which the SMCC circuit 200 is used in DCR 100, LNA 104 provides V_sig to the input terminals 212, 214. That is, LNA 104 provides V_sig+ to input terminal 212 and V_sig− to input terminal 214. The first frequency mixer 106 has an oscillator signal input terminal 220. The oscillator signal input terminal 220 may be provided with an oscillator signal. In one embodiment, oscillator signal is provided by local oscillator 122 (see FIG. 1).

The first frequency mixer 106 has mixer output terminals 232, 234. Mixer output terminal 232 is connected to positive input terminal 204a of the first differential stage 202a. Mixer output terminal 234 is connected to negative input terminal 206a of the first differential stage 202a. The first frequency mixer 106 generates an output signal (or "first mixer signal") at the mixer output terminals 232, 234 that has a frequency that depends on the frequency of the input signal V_sig and the frequency of the oscillator signal. In one embodiment, the first frequency mixer 106 is a down-mixer. In one embodiment, the first frequency mixer 106 frequency down converts an RF signal received on input terminals 212, 214 by the oscillator signal frequency.

The second frequency mixer 108 has input terminals 222, 224, which are configured to receive an input signal, and to provide the input signal to electrical components in the second frequency mixer 108. Together input terminals 222 and 224 receive an input signal (V_sig). Note that this is the same signal that is provided to the first frequency mixer 106. Input terminal 222 receives V_sig+, whereas input terminal 224 receives V_sig−. In an embodiment in which the SMCC circuit 200 is used in DCR 100, LNA 104 provides V_sig to the input terminals 222, 224. That is, LNA 104 provides V_sig+ to input terminal 222 and V_sig− to input terminal 224. The first frequency mixer 108 has an oscillator signal input terminal 248. The oscillator signal input terminal 248 may be provided with an oscillator signal. In one embodiment, oscillator signal is provided by local oscillator 122 (see FIG. 1). Note that the oscillator signals that are provided to the first and second frequency mixers 106, 108 each have the same frequency.

The second frequency mixer 108 has mixer output terminals 242, 244. Mixer output terminal 242 is connected to positive input terminal 204b of the second differential stage 202b. Mixer output terminal 244 is connected to negative input terminal 206b of the second differential stage 202b. The second frequency mixer 108 generates an output signal (or "second mixer signal") at the mixer output terminals 242, 244 that has a frequency that depends on the frequency of the input signal V_sig and the frequency of the oscillator signal. In one embodiment, the second frequency mixer 108 is a down-mixer. In one embodiment, the second frequency mixer 108 frequency down converts an RF signal received on input terminals 222, 224 by the oscillator signal frequency.

Several currents have been labeled in FIG. 2. Mixer output terminal 232 of first frequency mixer 106 provides input current I_Sig1+ to positive input terminal 204a of the first differential stage 202a. Mixer output terminal 234 of first frequency mixer 106 provides input current I_Sig1− to negative input terminal 206a of the first differential stage 202a.

Mixer output terminal 242 of second frequency mixer 108 receives input current I_Sig2+ from positive input terminal 204b of the second differential stage 202b. Mixer output terminal 234 of second frequency mixer 106 receives input current I_Sig2− from negative input terminal 206b of the second differential stage 202b.

Note that both the first stage 202a and the second stage 202b are able to process the input signal current (I_sig). By processing the input signal current (I_sig), it is meant that the stage responds to a change in the magnitude of the input signal current at an input terminal (e.g., 204a, 204b, 206a, 206b) by effecting a change in the current at the respective output terminal (e.g., 230a, 230b). However, this does not mean that the two stages will be necessarily conducting the same magnitude current as each other. In other words, at a given point in time, one stage could be conducting a larger current than the other stage. The magnitudes of the currents output by the two stages 202a, 202b may be different whenever the current conveyor produces a non-zero output signal current. For example, the difference between I_sig1+ and I_sig2+ (minus any losses) is equal to the output current I_out+ at 230a, in one embodiment. Likewise, the difference between the I_sig1− and I_sig2− (minus any losses) is equal to the output current I_out− at 230b, in one embodiment.

In one embodiment, the first stage 202a and the second stage 202b operate in a push-pull mode. By operating in a push-pull mode, the current conveyer 110 is able to process a larger signal current than a quiescent bias current of the current conveyer 110. For example, the first stage 202a may supply a current to a load (not depicted in FIG. 2) between current conveyer output terminals 230a, 230b, and the second stage 202b may sink a current from the load. However, as noted above, this does not mean that the two stages will necessarily be conducting the same magnitude current as each other. In one embodiment, the first stage 202a provides a current to the current conveyer output for more than 180 degrees but less than 360 degrees of the output signal; also the second stage 202b may sink a current from the current conveyer output for more than 180 degrees but less than 360 degrees of the output signal.

In one embodiment, the current conveyer 110 operates as a class AB amplifier. By operating as a class AB amplifier, the current conveyer 110 is able to process a larger input signal current than a quiescent bias current of the current conveyer 110. This allows the current conveyer 110 to use a smaller quiescent bias current, relative to a circuit for which the quiescent bias current needs to be as large as the largest input signal current to be processed. By being able to use a smaller quiescent bias current, both current and power are saved.

In one embodiment, the current conveyer 110 is a fully differential current conveyer. A fully differential current conveyer refers to a current conveyer having both a differential input and a differential output. The current conveyer 110 may also be referred to as a dual differential input/single differential output current conveyer.

Figure 3:
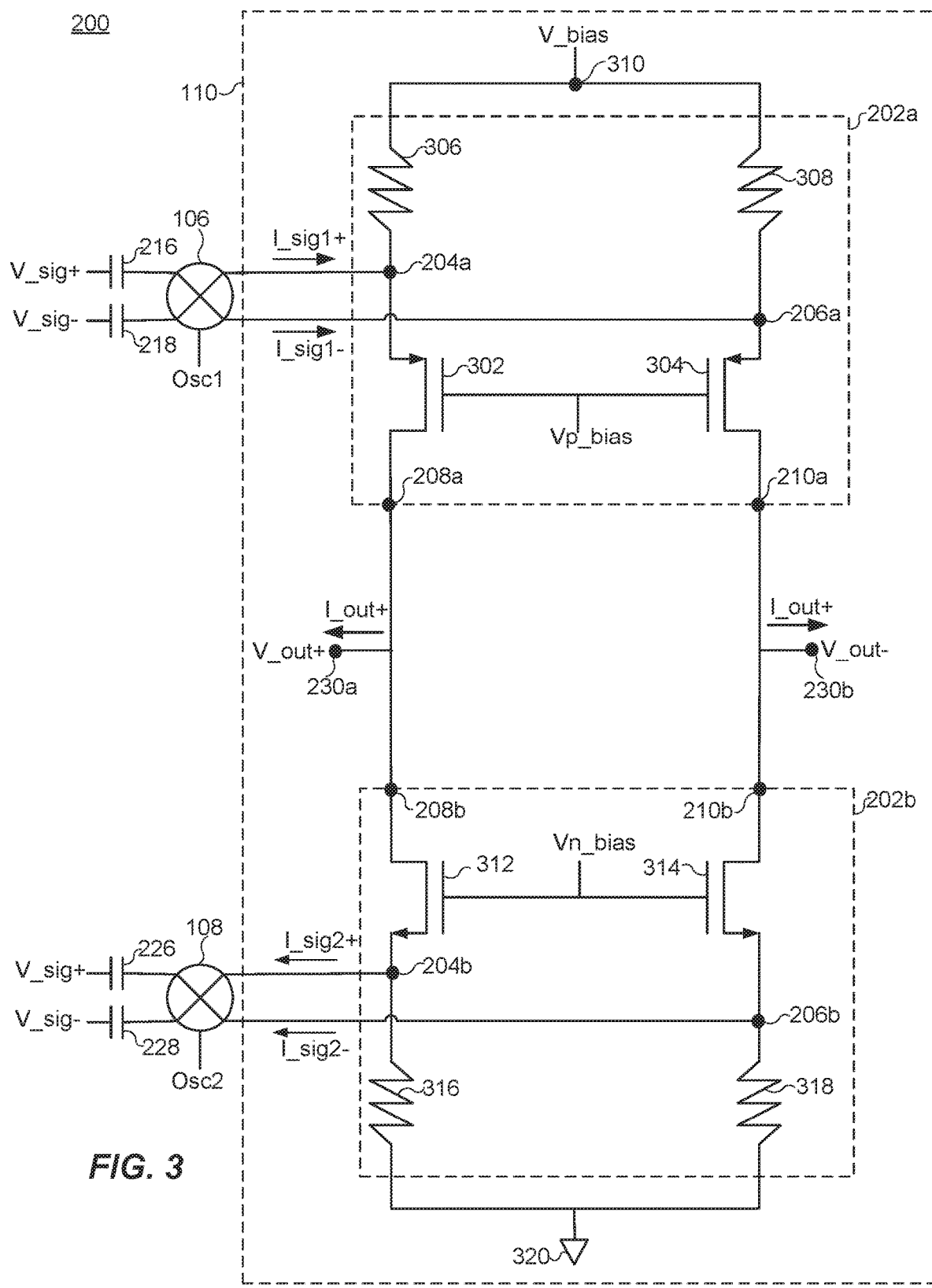
FIG. 3 is a schematic diagram of one embodiment of an SMCC circuit.

FIG. 3 is a schematic diagram of one embodiment of SMCC circuit 200. SMCC circuit 200 of FIG. 3 may be used for either SMCC circuit 200a or 200b in the DCR 100 of FIG. 1. SMCC circuit 200 of FIG. 3 is one embodiment of SMCC circuit 200 of FIG. 2. In the embodiment of FIG. 3, the first and second differential stages 202a, 202b include common gate differential amplifiers.

The first differential stage 202a includes first PMOS transistor 302, second PMOS transistor 304, first resistor 306, and second resistor 308. The gates of first and second PMOS transistors 302, 304 are connected together. A bias voltage Vp_bias may be applied to the gates of the first and second PMOS transistors 302, 304. The source of first PMOS transistor 302 is the positive input terminal 204a of first stage 202a, in one embodiment. The source of second PMOS transistor 304 is the negative input terminal 206a of first stage 202a, in one embodiment. The sources of first and second PMOS transistors 302, 304 may also be referred to as input terminals. The drain of first PMOS transistor 302 is the positive output terminal 208a of first stage 202a, in one embodiment. The drain of second PMOS transistor 304 is the negative output terminal 210b of first stage 202a, in one embodiment. The drains of first and second PMOS transistors 302, 304 may also be referred to as output terminals. First resistor 306 is connected between the source of first PMOS transistor 302 and a terminal 310 to which a bias voltage V_bias may be applied. Second resistor 308 is connected between the source of second PMOS transistor 304 and the terminal 310 to which the bias voltage V_bias may be applied.

The resistance value of the first resistor 306 and the second resistor 308, along with the magnitude of V_bias and the quiescent bias current through resistors 306, 308 may be used to establish a common mode operating voltage at first differential input terminals 204a, 206a. In one embodiment, first resistor 306 is replaced with a transistor that is biased as a current source, and second resistor 308 is replaced with a transistor that is biased as a current source.

The second differential stage 202b has a symmetrical configuration (with respect to the first differential stage 202a), but uses first NMOS transistor 312 and second NMOS transistor 314. The gates of first and second NMOS transistors 312, 314 are connected together. A bias voltage Vn_bias may be applied to the gates of the first and second NMOS transistors 312, 314. In one embodiment, the quiescent bias current is established by the gate bias voltage (Vn_bias) on the gates of the NMOS transistors 312, 314. Note that there may be a separate quiescent bias current in each "leg" of the current conveyer. For example, one quiescent bias current may pass through first resistor 306, first PMOS transistor 302, first NMOS transistor 312 and third resistor 316. Another quiescent bias current may pass through second resistor 308, second PMOS transistor 304, second NMOS transistor 314 and fourth resistor 318. Note that a larger resistance for resistors 306 and 308 directs a larger proportion of the signal current I_sig+ and Isig1− to pass through transistors 302 and 304 (as opposed to passing through resistors 306, 308).

The source of first NMOS transistor 312 is the positive input terminal 204b of second stage 202b in one embodiment. The source of second NMOS transistor 314 is the negative input terminal 206b of second stage 202b, in one embodiment. The sources of first and second NMOS transistors 312, 314 may also be referred to as input terminals. The drain of first NMOS transistor 312 is the positive output terminal 208b of second stage 202b, in one embodiment. The drain of second NMOS transistor 314 is the negative output terminal 210b of second stage 202b, in one embodiment. The drains of first and second NMOS transistors 312, 314 may also be referred to as output terminals. Third resistor 316 is connected between the source of first NMOS transistor 312 and ground 320. Fourth resistor 318 is connected between the source of second NMOS transistor 314 and ground 320.

Figure 8:
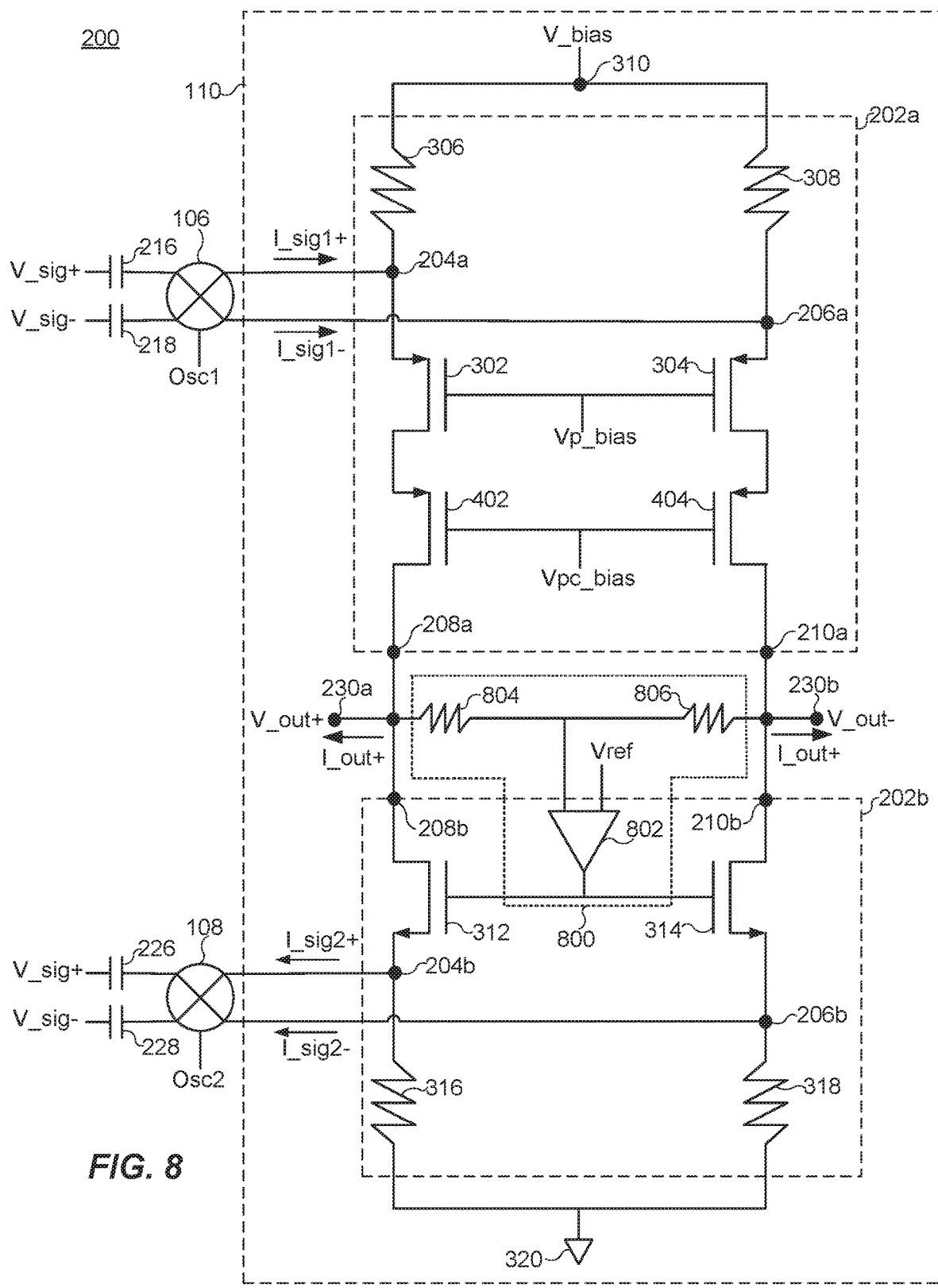
FIG. 8 is a schematic diagram of an SMCC circuit having a common mode voltage control circuit.

The resistance value of the third resistor 316 and the fourth resistor 318 may be used to establish a common mode operating voltage between the second differential input terminals 204b, 206b. The common mode operating voltage may be established by the quiescent bias current and the resistance value of third resistor 316 and the fourth resistor 318. Note that FIG. 8 shows one embodiment of an SMCC circuit 200 having circuit elements for setting a common mode operating voltage at the current conveyer output. Note that by using a larger resistance for the third resistor 316 and the fourth resistor 318, more of the signal current (I_sig2) can pass from NMOS transistors 312, 314 to the second frequency mixer 108 (as opposed to passing through resistors 316, 318).

In one embodiment, third resistor 316 is replaced with a transistor that is biased as a current source, and fourth resistor 318 is replaced with a transistor that is biased as a current source. A transistor biased as a current source can have a very high resistance, which can be beneficial in having a very large percentage of the signal current (I_sig2) being delivered from the NMOS transistors 312, 314 to the second frequency mixer 108. Note that if the resistors 306, 308, 316, 318 are replaced by current sources, then a similar scheme may be used to establish the common mode operating voltages. In one embodiment, either the current sources in the first stage 202a or the second stage 202b are set to an arbitrary value. Then, the other current sources are set at a value to establish a desired common mode output voltage. The common mode voltages for the differential input of stage 202a may be established by the bias voltage Vp_bias on the gates of the first PMOS transistor 302 and the second PMOS transistor 304. The common mode voltages for the differential input of second stage 202b may be established by the bias voltage Vn_bias on the gates of the first NMOS transistor 312 and the second NMOS transistor 314.

Discussion of SMCC circuit 200 of FIG. 3 will now proceed to the frequency mixers 106, 108. First frequency mixer 106 is connected to first signal coupling capacitor 216 and second signal coupling capacitor 218 to allow the first frequency mixer 106 to receive the input signal V_sig. Together first and second signal coupling capacitors 216, 218 receive the input signal (V_sig), and couple the input signal to the first frequency mixer 106. The input signal could be a component of an RF signal. First signal coupling capacitor 216 receives V_sig+, whereas second signal coupling capacitor 218 receives V_sig−. In an embodiment in which the SMCC circuit 200 is used in DCR 100, LNA 104 provides V_sig+ to first signal coupling capacitor 216, and provides V_sig− to second signal coupling capacitor 218. First frequency mixer 106 receives an oscillator signal (Osc1). In one embodiment, oscillator signal is provided by local oscillator 122 (see FIG. 1). The first frequency mixer 106 alters the frequency of the input signal (V_sig) by the frequency of the oscillator signal (Osc1). In one embodiment, the first frequency mixer 106 is a down-mixer that reduces the frequency of the input signal (V_sig) by the frequency of the oscillator signal (Osc1). In one embodiment, the first frequency mixer 106 is an up-mixer that increases the frequency of the input signal (V_sig) by the frequency of the oscillator signal (Osc1).

First frequency mixer 106 provides current I_sig1+ to the source of first PMOS transistor 302 (which is the positive input terminal 204a of the first differential stage 202a, in one embodiment). First frequency mixer 106 provides current I_sig1− to the source of second PMOS transistor 304 (which is the negative input terminal 206a of the first differential stage 202a, in one embodiment). Note that first and second signal coupling capacitors 216, 218 may be considered to be a part of the first frequency mixer 106 or, alternatively, may be considered to be external to the first frequency mixer 106.

Second frequency mixer 108 is connected to third signal coupling capacitor 226 and fourth signal coupling capacitor 228 to allow the second frequency mixer 108 to receive the input signal V_sig. Together third and fourth signal coupling capacitors 226, 228 receive the input signal (V_sig) and couple the input signal to the second frequency mixer 108. Note that this is the same input signal that is provided to the first and second signal coupling capacitors 216, 218 that are connected to the first frequency mixer 106. Third signal coupling capacitor 226 receives V_sig+, whereas fourth signal coupling capacitor 228 receives V_sig−. In an embodiment in which the SMCC circuit 200 is used in DCR 100, LNA 104 provides V_sig+ to third signal coupling capacitor 226, and provides V_sig− to fourth signal coupling capacitor 228. Second frequency mixer 108 receives an oscillator signal (Osc2). Note that the term "Osc" may be used when referring to both Osc1 and Osc2, or when reference is not being made specifically to either Osc1 or Osc2. In one embodiment, oscillator signal is provided by local oscillator 122 (see FIG. 1). Note that the oscillator signal that is provided to the first frequency mixer 106 and the oscillator signal that is provided to the second frequency mixer 108 have the same frequency. Therefore, since the first and second frequency mixers 106, 108 receive the same input signal (V_sig) and have the same frequency oscillator signal, the signal that is output by the second frequency mixer 108 has the same frequency as the signal that is output by the first frequency mixer 106. The oscillator signal that is provided to the first frequency mixer 106 and the oscillator signal that is provided to the second frequency mixer 108 have the same frequency and the same phase, in one embodiment. However, it is not required that the phase be the same.

In one embodiment, the first and second frequency mixers 106, 108 are each a down-mixer that reduce the frequency of the input signal (V_sig) by the frequency of the oscillator signal (Osc). In one embodiment, the first and second frequency mixers 106, 108 are each an up-mixer that increases the frequency of the input signal (V_sig) by the frequency of the oscillator signal (Osc).

Note that the DC (Direct Current) voltage at the positive input terminal 204a of the first differential input of the first stage 202a is higher than the DC voltage at the positive input terminal 204b of the second differential input of the second stage 202b, in one embodiment. Likewise, the DC voltage at the negative input terminal 206a of the first differential input of the first stage 202a is higher than the DC voltage at the negative input terminal 206b of the second differential input of the second stage 202b, in one embodiment. Also note that the first differential input is connected to the first frequency mixer 106, and the second differential input is connected to the second frequency mixer 108. Thus, the DC voltage at the output of the first mixer 106 is higher than the DC voltage at the output of the second mixer 108, in one embodiment. However, the first and second frequency mixers 106, 108 receive the same input signal (V_sig). The signal coupling capacitors 216, 218, 226, 228 block the DC voltage level of the input signal (V_sig), in one embodiment, to accommodate for the different DC voltages at the first and second differential inputs of the current conveyer 110.

Second frequency mixer 108 receives current I_sig2+ from the source of first NMOS transistor 312 (which is a positive input terminal 204b of the second differential stage 202b, in one embodiment). Second frequency mixer 108 receives current I_sig2− from the source of second NMOS transistor 314 (which is an input 206b of the second differential stage 202b, in one embodiment). Note that third and fourth signal coupling capacitors 226, 228 may be considered to be a part of the second frequency mixer 108 or, alternatively, may be considered to be external to the second frequency mixer 108.

Note that the signal coupling capacitors 216, 218 are on the high frequency side of the first frequency mixer 106, in embodiments in which the first frequency mixer 106 is a down-mixer. Likewise, signal coupling capacitors 226, 228 are on the high frequency side of the second frequency mixer 108, in embodiments in which the second frequency mixer 108 is a down-mixer. Having the signal coupling capacitors 216, 218, 226, 228 on the high frequency side of the frequency mixers 106, 108 allows the signal coupling capacitors 216, 218, 226, 228 to be smaller than if signal coupling capacitors were placed on the low frequency side of frequency mixers 106, 108. An example of placing signal coupling capacitors on the low frequency side of frequency mixers 106, 108 would be to place signal coupling capacitors between the frequency mixers 106, 108 and the differential inputs of the current conveyer (assuming the frequency mixers 106, 108 are down-mixers).

The current conveyer 110 has a current conveyer positive output terminal 230a that is between the first PMOS transistor 302 and the first NMOS transistor 312. More particularly, the current conveyer positive output terminal 230a is between the drain of the first PMOS transistor 302 and the drain of first NMOS transistor 312. In the embodiment of FIG. 3, the drain of the first PMOS transistor 302 is directly connected to the drain of first NMOS transistor 312. However, there could be one or more circuit elements between the drain of the first PMOS transistor 302 and the drain of first NMOS transistor 312.

In some embodiments, the positive output terminal 208a of the first stage 202a is directly connected to the positive output terminal 208b of the second stage 202b. Thus, in some embodiments, the current conveyer positive output terminal 230a is directly connected to both the positive output terminal 208a of the first stage 202a and to the positive output terminal 208b of the second stage 202b.

The current conveyer 110 has a current conveyer negative output terminal 230b that is between the second PMOS transistor 304 and the second NMOS transistor 314. More particularly, the current conveyer negative output terminal 230b is between the drain of the second PMOS transistor 304 and the drain of second NMOS transistor 314. In the embodiment of FIG. 3, the drain of the second PMOS transistor 304 is directly connected to the drain of second NMOS transistor 314. However, there could be one or more circuit elements between the drain of the second PMOS transistor 304 and the drain of second NMOS transistor 314.

In some embodiments, the negative output terminal 210a of the first stage 202a is directly connected to the negative output terminal 210b of the second stage 202b. Thus, in some embodiments, the current conveyer negative output terminal 230b is directly connected to both the negative output terminal 210a of the first stage 202a and to the negative output terminal 210b of the second stage 202b.

Note that the current conveyer 110 of FIG. 3 has a low input impedance. Note that the current conveyer 110 of FIG. 3 has a high output impedance. This is the case since the current conveyor 110 is the combination of two common gate amplifiers operating in tandem. A common gate amplifier has a low input impedance on the order of 1/gm of the input transistor while exhibiting a high output impedance on the order of the output impedance of the transistor, in one embodiment.

By operating in a push-pull mode, the current conveyer 110 is able to process a larger signal current than the quiescent bias current of the current conveyer 110. For example, the quiescent bias current through first resistor 306 can be smaller than the input signal current (I_sig1+) without the current conveyer clipping. Likewise, the quiescent bias current through second resistor 308 can be smaller than the signal current (I_sig1−) without the current conveyer clipping. Likewise, the quiescent bias current through third resistor 316 can be smaller than the signal current (I_sig2−) without the current conveyer clipping. Likewise, the quiescent bias current through fourth resistor 318 can be smaller than the signal current (I_sig2−) without the current conveyer clipping. Hence, a smaller quiescent bias current can be used, relative to a circuit for which the quiescent bias current needs to be as large as the largest input signal current to be processed. By being able to use a smaller quiescent bias current, both current and power are saved.

Note that the embodiment of the SMCC circuit 200 in FIG. 3 does not use cascode transistors in either the first stage 202a or the second stage 202b. By not using cascode transistors, the SMCC circuit 200 can operate at a lower supply voltage. In some embodiments, cascode transistors are added to the first stage 202a and/or the second stage 202b. Adding cascode transistors can help to improve isolation between the first and/or second differential input and the current conveyer output, increase the output impedance of the current conveyer, and reduce the dependence of the current conveyor input impedance on the current conveyor load.

Figure 4:
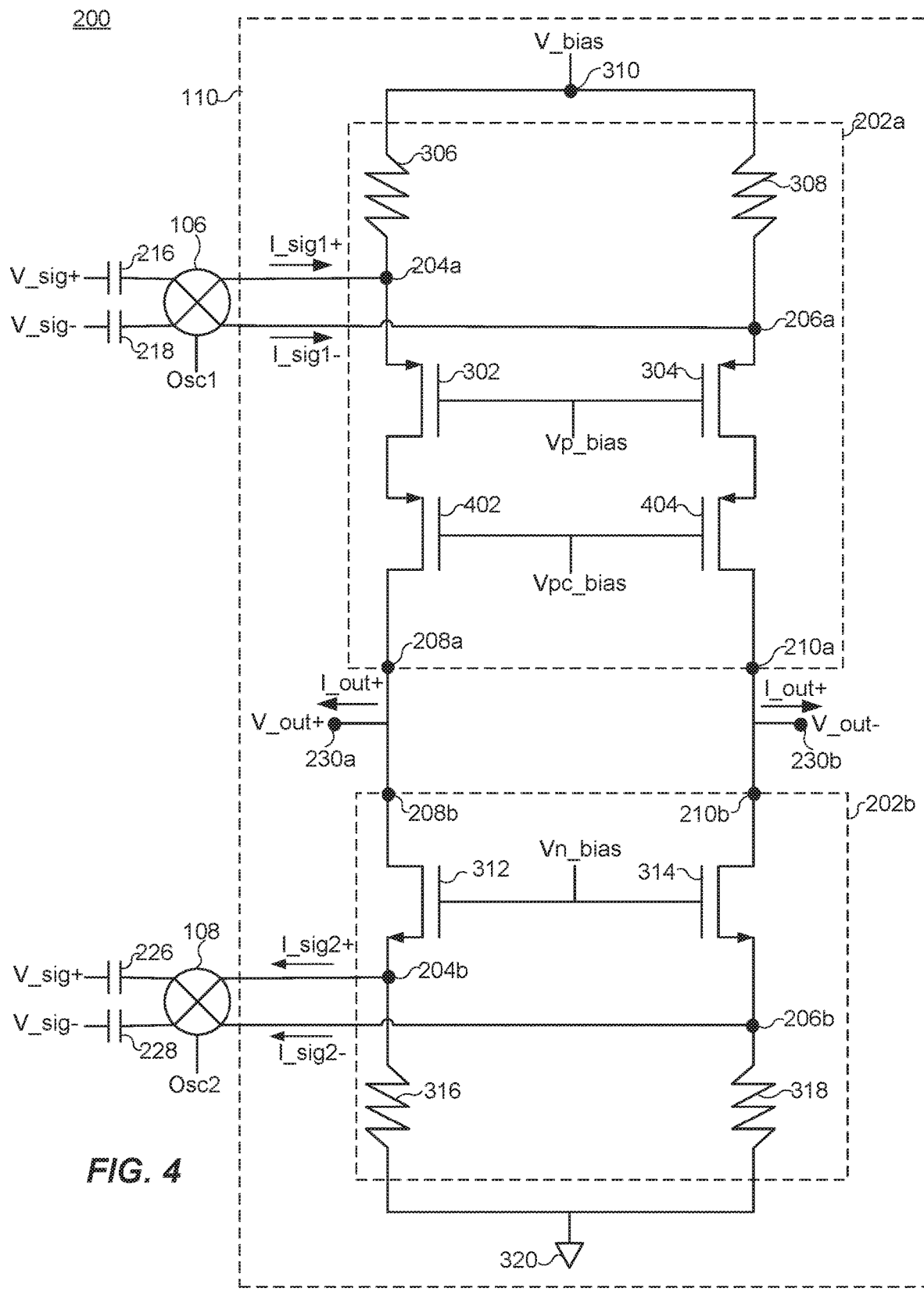
FIG. 4 is a schematic diagram of one embodiment of an SMCC circuit having a pair of cascode transistors.

FIG. 4 is a schematic diagram of one embodiment of an SMCC circuit 200 having a pair of cascode transistors in the first stage 202a. SMCC circuit 200 may be used in the DCR 100 in FIG. 1. In one embodiment, two SMCC circuits 200 having identical properties (noting that there may be some differences due to limitations of the manufacturing process, etc.) are used for SMCC 200a and SMCC 200b in FIG. 1. SMCC circuit 200 of FIG. 4 is one embodiment of SMCC circuit 200 of FIG. 2. The embodiment of FIG. 4 is similar to the embodiment of FIG. 3, but adds a pair of PMOS cascode transistors 402, 404 to the first differential stage 202a. The pair of PMOS cascode transistors 402, 404 help to improve isolation between the first differential input of the first stage 202a and the differential output of the current conveyer.

The gate of first PMOS cascode transistor 402 is connected to the gate of second PMOS cascode transistor 404. A bias voltage Vpc_bias may be applied to the gates of the PMOS cascode transistors 402, 404. The source of first PMOS cascode transistor 402 is connected to the drain of first PMOS transistors 302. The source of second PMOS cascode transistor 404 is connected to the drain of second PMOS transistors 304. The positive output terminal 208a of the first stage 202a is at the drain of first PMOS cascode transistor 402, in one embodiment. The negative output terminal 210a of the first stage 202a is at the drain of second PMOS cascode transistor 404, in one embodiment.

Note that in the embodiment of FIG. 4, the positive output terminal 208a of the first stage 202a, the positive output terminal 208b of the second stage 202b, and the current conveyer positive output terminal 230a are at the same node. Likewise, in the embodiment of FIG. 4, the negative output terminal 210a of the first stage 202a, the negative output terminal 210b of the second stage 202b, and the current conveyer negative output terminal 230b are at the same node. Stated in other terms, the positive output terminal 208a of the first stage 202a is directly connected to the positive output terminal 208b of the second stage 202b, with the current conveyer positive output terminal 230a being at that junction. Similarly, the negative output terminal 210a of the first stage 202a is directly connected to the negative output terminal 210b of the second stage 202b, with the current conveyer negative output terminal 230b being at that junction.

Figure 5:
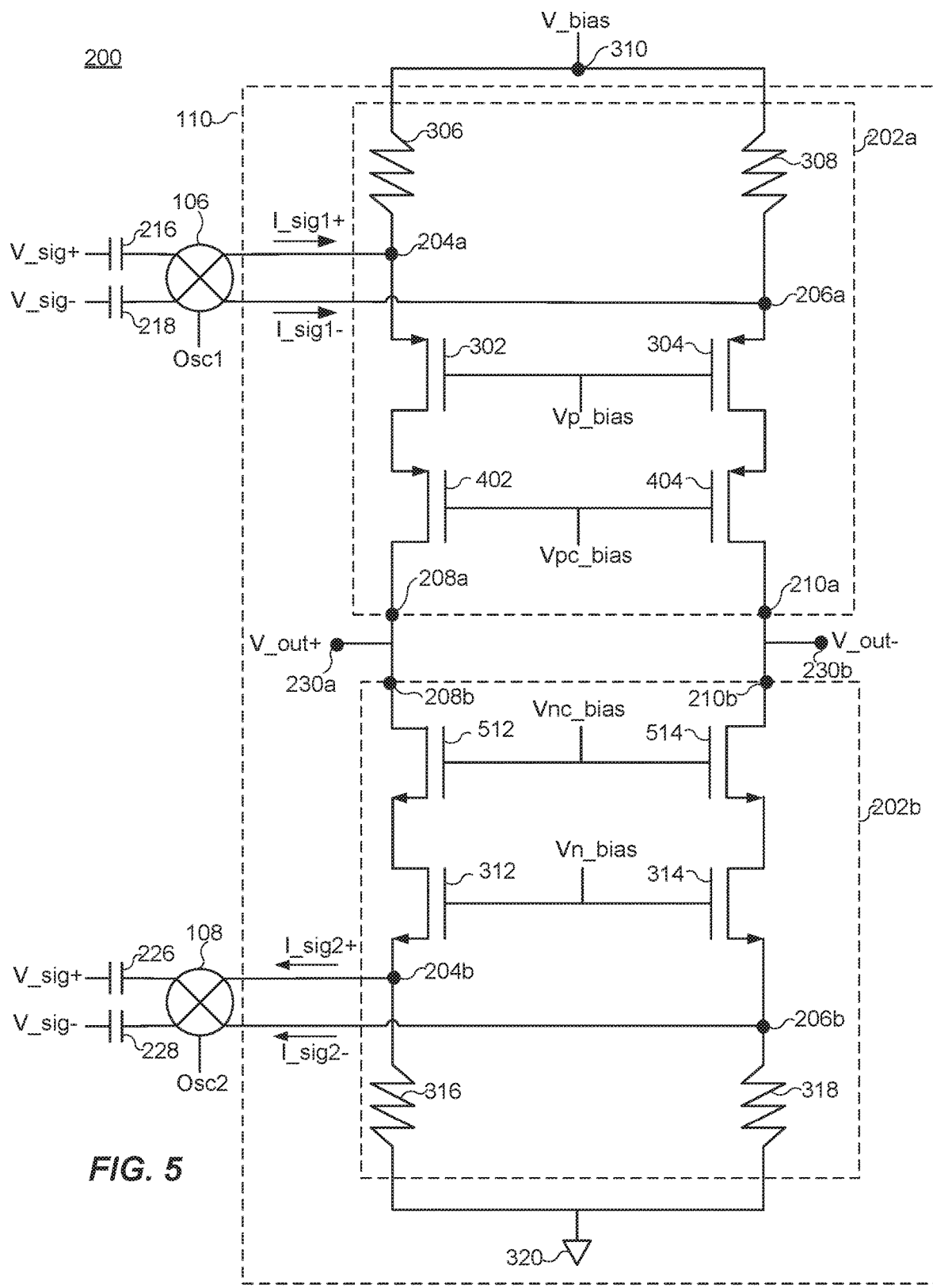
FIG. 5 is a schematic diagram of one embodiment of an SMCC circuit having two pairs of cascode transistors.

FIG. 5 is a schematic diagram of one embodiment of an SMCC circuit 200 having two pairs of cascode transistors. SMCC circuit 200 of FIG. 5 may be used in the DCR 100 in FIG. 1. In one embodiment, two SMCC circuits 200 having identical properties (noting that there may be some differences due to limitations of the manufacturing process, etc.) are used for SMCC 200a and SMCC 200b in FIG. 1. SMCC circuit 200 of FIG. 5 is one embodiment of SMCC circuit 200 of FIG. 2. The embodiment of FIG. 5 is similar to the embodiment of FIG. 4, but adds a pair of NMOS cascode transistors 512, 514 to the second differential stage 202b. The pair of NMOS cascode transistors 512, 514 help to improve isolation between the second differential input of the second stage 202b and the differential output of the current conveyer, increase the output impedance of the current conveyor, and reduce the dependence of the current conveyor input impedance on the current conveyor load.

The gate of first NMOS cascode transistor 512 is connected to the gate of second NMOS cascode transistor 514. A bias voltage Vnc_bias may be applied to the gates of the NMOS cascode transistors 512, 514. The source of first NMOS cascode transistor 512 is connected to the drain of first NMOS transistor 312. The source of second NMOS cascode transistor 514 is connected to the drain of second NMOS transistors 314. The drain of first NMOS cascode transistor 512 is connected to the drain of first PMOS cascode transistor 402. The drain of second NMOS cascode transistor 514 is connected to the drain of second PMOS cascode transistor 404.

The positive output terminal 208b of the second stage 202b is at the drain of first NMOS cascode transistor 512, in one embodiment. The negative output terminal 210b of the second stage 202b is at the drain of second NMOS cascode transistor 514, in one embodiment. Note that in the embodiment of FIG. 5, the positive output terminal 208a of the first stage 202a, the positive output terminal 208b of the second stage 202b, and the current conveyer positive output terminal 230a are at the same node. Likewise, in the embodiment of FIG. 5, the negative output terminal 210a of the first stage 202a, the negative output terminal 210b of the second stage 202b, and the current conveyer negative output terminal 230b are at the same node. Stated in other terms, the positive output terminal 208a of the first stage 202a is directly connected to the positive output terminal 208b of the second stage 202b, with the current conveyer positive output terminal 230a being at that junction. Similarly, the negative output terminal 210a of the first stage 202a is directly connected to the negative output terminal 210b of the second stage 202b, with the current conveyer negative output terminal 230b being at that junction.

Figure 6A:
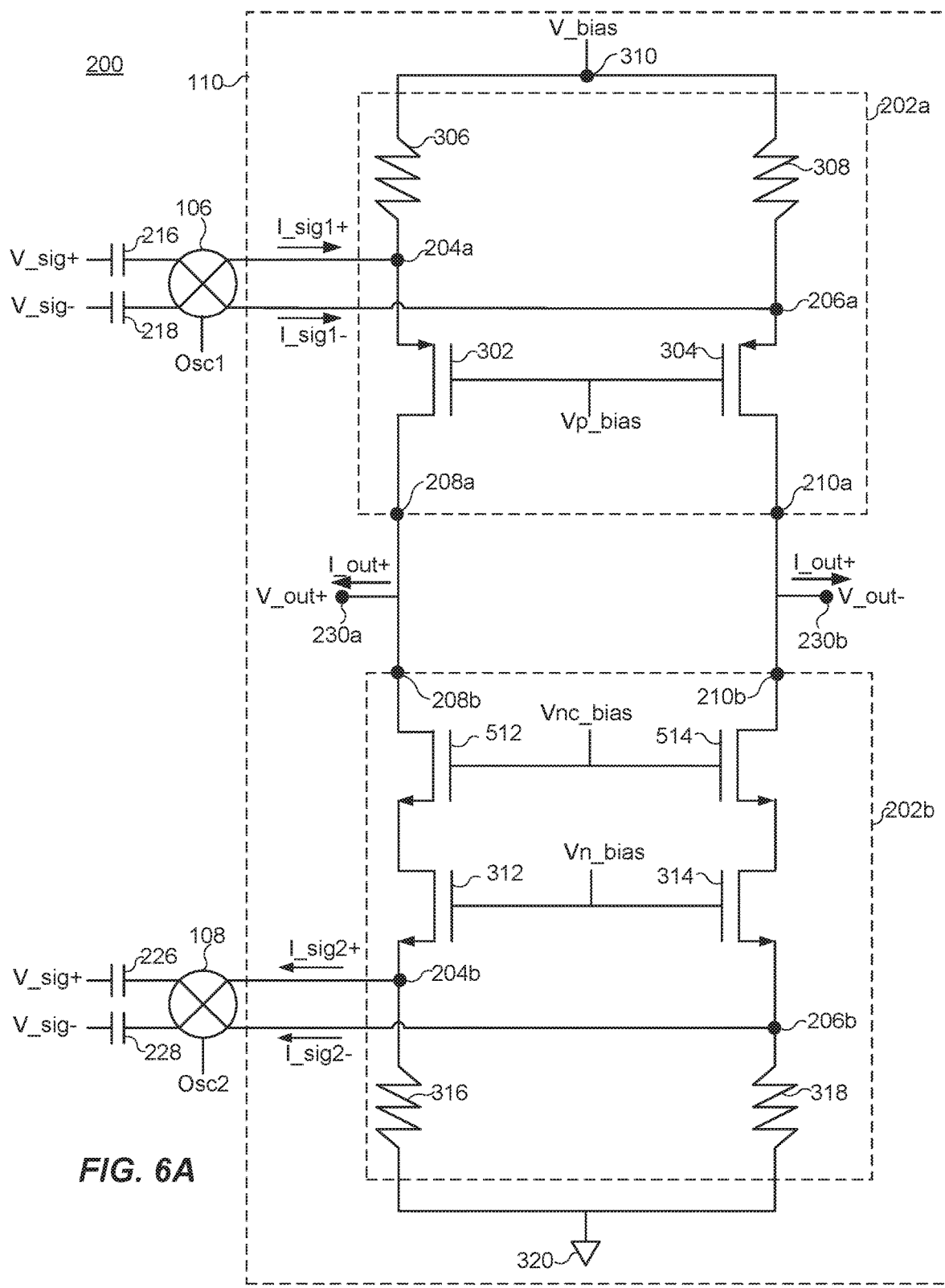
FIG. 6A is a schematic diagram of one embodiment of an SMCC circuit having a pair of cascode transistors in the second stage.

FIG. 6A is a schematic diagram of one embodiment of an SMCC circuit 200 having a pair of cascode transistors in the second stage. SMCC circuit 200 of FIG. 6A may be used in the DCR 100 in FIG. 1. In one embodiment, two SMCC circuits 200 having identical properties (noting that there may be some differences due to limitations of the manufacturing process, etc.) are used for SMCC 200a and SMCC 200b in FIG. 1. SMCC circuit 200 of FIG. 6A is one embodiment of SMCC circuit 200 of FIG. 2. The embodiment of FIG. 6A is similar to the embodiment of FIG. 5, but does not have the pair of PMOS cascode transistors 402, 404 in the first differential stage 202a. The pair of NMOS cascode transistors 512, 514 help to improve isolation between the second differential input of the second stage 202b and the differential output of the current conveyer, increase the output impedance of the current conveyor, and reduce the dependence of the current conveyor input impedance on the current conveyor load.

The drain of first NMOS cascode transistor 512 is connected to the drain of first PMOS transistor 302. The drain of second NMOS cascode transistor 514 is connected to the drain of second PMOS transistor 304.

Note that in the embodiment of FIG. 6A, the positive output terminal 208a of the first stage 202a, the positive output terminal 208b of the second stage 202b, and the current conveyer positive output terminal 230a are at the same node. Likewise, in the embodiment of FIG. 6A, the negative output terminal 210a of the first stage 202a, the negative output terminal 210b of the second stage 202b, and the current conveyer negative output terminal 230b are at the same node. Stated in other terms, the positive output terminal 208a of the first stage 202a is directly connected to the positive output terminal 208b of the second stage 202b, with the current conveyer positive output terminal 230a being at that junction. Similarly, the negative output terminal 210a of the first stage 202a is directly connected to the negative output terminal 210b of the second stage 202b, with the current conveyer negative output terminal 230b being at that junction.

Figure 6B:
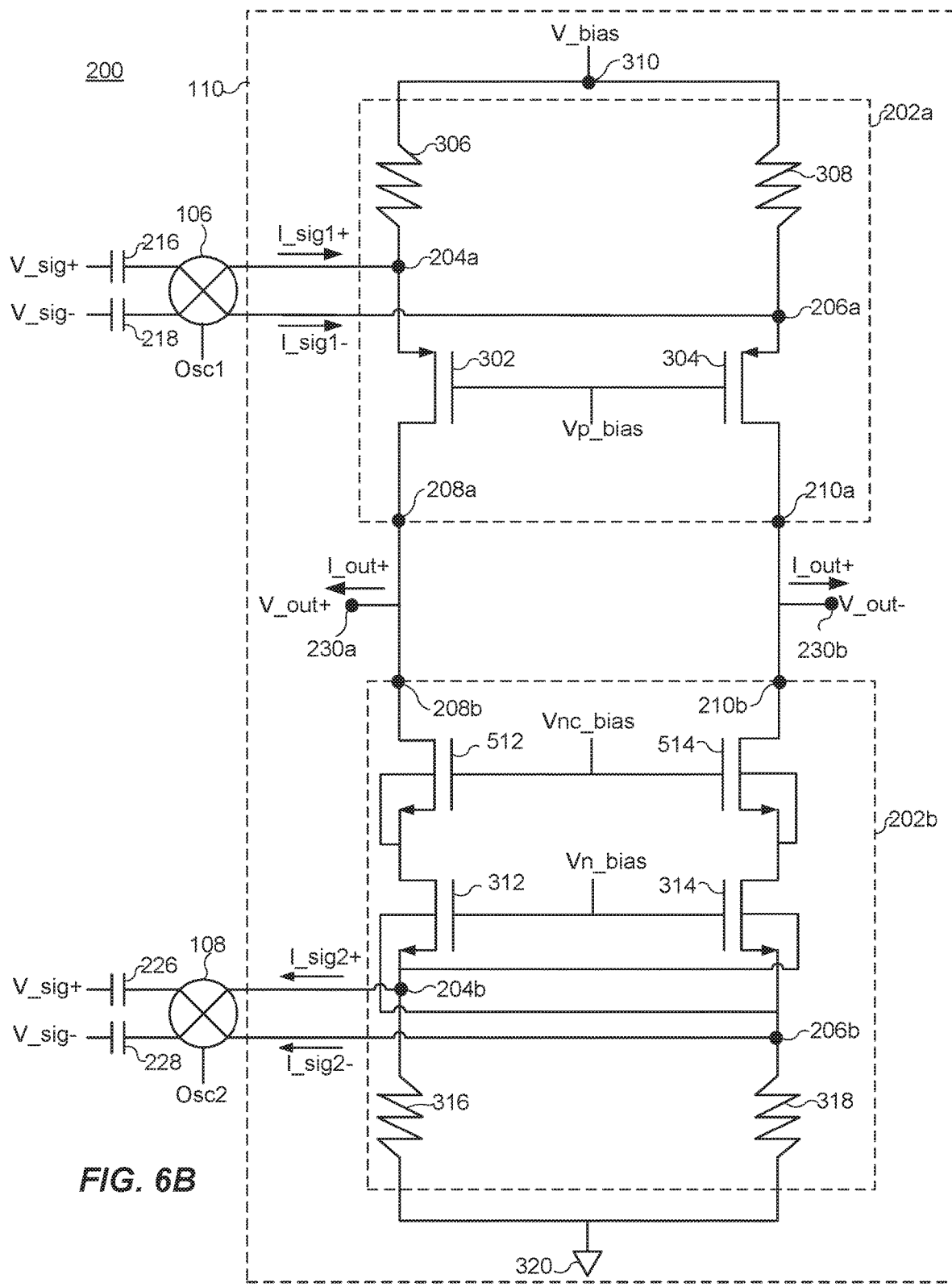
FIG. 6B is a schematic diagram of one embodiment of bulk connections in an SMCC circuit having a pair of cascode transistors in the second stage.

FIG. 6B is a schematic diagram of one embodiment of bulk connections in an SMCC circuit 200 having a pair of cascode transistors in the second stage 202b. SMCC circuit 200 of FIG. 6B may be used in the DCR 100 in FIG. 1. In one embodiment, two SMCC circuits 200 having identical properties (noting that there may be some differences due to limitations of the manufacturing process, etc.) are used for SMCC 200a and SMCC 200b in FIG. 1. The bulk of first NMOS transistor 312 is tied to the source of second NMOS transistor 314. Likewise, the bulk of second NMOS transistor 314 is tied to the source of first NMOS transistor 312. This cross-coupling of the bulks of the NMOS transistors 312, 314 can reduce the input impedance of the current conveyer. Lowering the input impedance of the current conveyer may improve the performance of the current conveyer. Note that a similar cross-coupling of the bulks can be used on the PMOS side.

The bulk of first NMOS cascode transistor 512 is tied to its source. Likewise, the bulk of second NMOS cascode transistor 514 is tied to its source. Connecting the bulk to the source for the NMOS cascode transistors 512, 514 is optional, and does not necessarily need to be done when cross-coupling the bulks of the NMOS transistors 312, 314.

Figure 7:
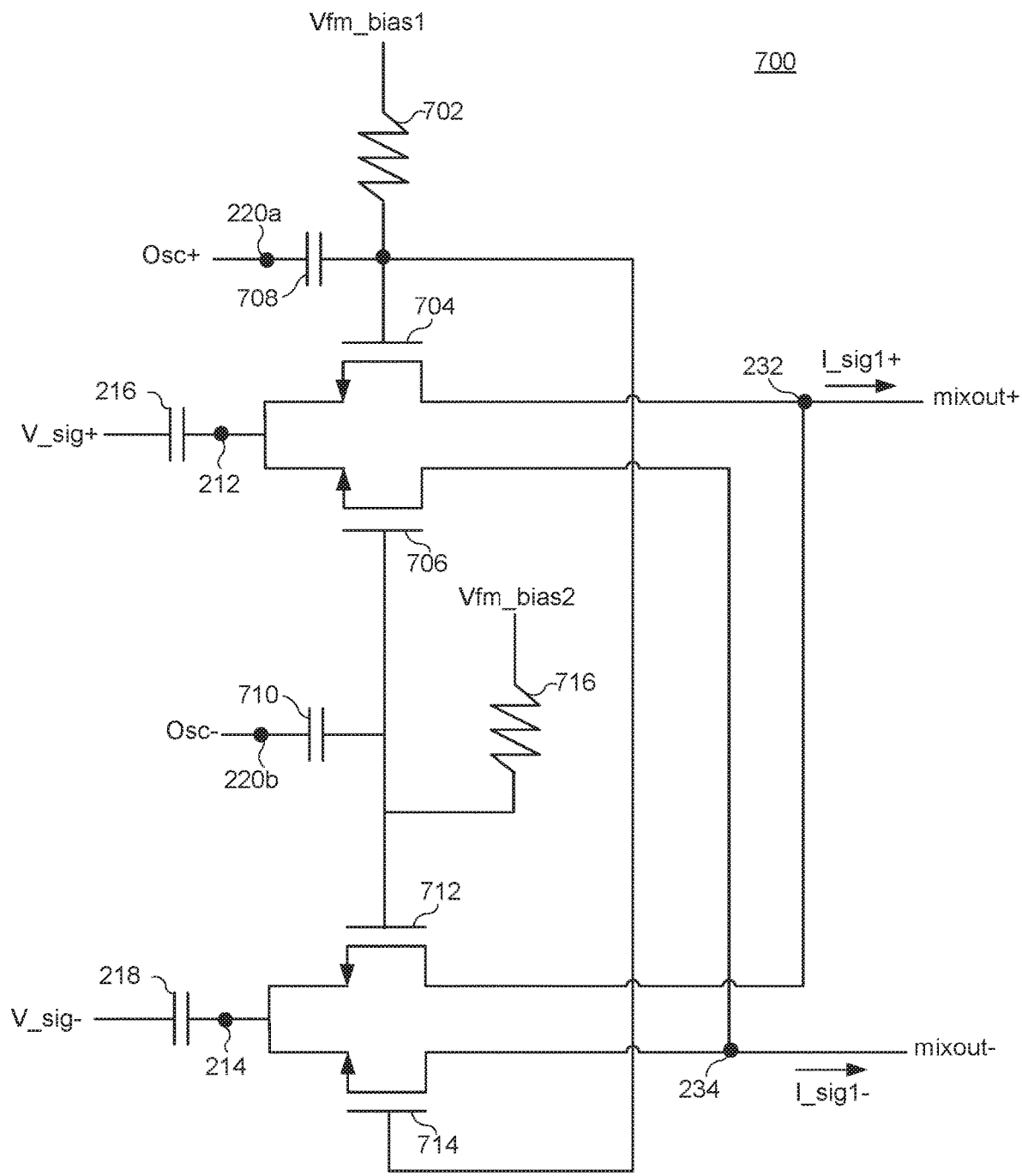
FIG. 7 is a schematic diagram of one embodiment of a circuit having a frequency mixer and two signal coupling capacitors.

FIG. 7 is a schematic diagram of one embodiment of a circuit 700 having a frequency mixer and two signal coupling capacitors 216, 218. The two signal coupling capacitors 216, 218 could be considered to be part of the frequency mixer. However, for the sake of discussion, the signal coupling capacitors 216, 218 will be discussed as being connected to inputs 212, 214 of the frequency mixer. The frequency mixer will be described with respect to reference numerals of frequency mixer 106, but can also be used for frequency mixer 108.

First input terminal 212 is connected to signal coupling capacitor 216. Second input terminal 214 is connected to signal coupling capacitor 218. Signal coupling capacitor 216 receives V_sig+, whereas signal coupling capacitor 218 receives V_sig−. The signal coupling capacitors 216, 218 couple the input signal to the input terminals 212, 214. Thus, together input terminals 212 and 214 receive the input signal (V_sig). The input signal could be a component of an RF signal.

Oscillator signal positive input terminal 220a receives Osc+. Oscillator signal negative input terminal 220b receives Osc−. Thus, together the oscillator signal positive and negative input terminals 220a, 220b receive the oscillator signal (Osc). The oscillator signal is provided by local oscillator (FIG. 1, 122), in one embodiment. Oscillator signal positive input terminal 220a is connected to first oscillator capacitor 708. Oscillator signal negative input terminal 220b is connected to second oscillator capacitor 710. First oscillator capacitor 708 is connected to first mixer resistor 702, which may be supplied with a bias voltage Vfm_bias1. Second oscillator capacitor 710 is connected to second mixer resistor 716, which may be supplied with a bias voltage Vfm_bias2.

A first pair of NMOS transistors 704, 706 are connected to the first input terminal 212. More particularly, the source of NMOS transistor 704 is connected to the first input terminal 212, and the source of NMOS transistor 706 is connected to the first input terminal 212. The gate of NMOS transistor 704 is connected to first mixer resistor 702, as well as first oscillator capacitor 708. The drain of NMOS transistor 704 is connected to mixer positive output terminal 232. The drain of NMOS transistor 706 is connected to mixer negative output terminal 234.

A second pair of NMOS transistors 712, 714 are connected to the second input terminal 214. More particularly, the source of NMOS transistor 712 is connected to the second input terminal 214, and the source of NMOS transistor 714 is connected to the second input terminal 214. The gate of NMOS transistor 714 is connected to first mixer resistor 702. The drain of NMOS transistor 712 is connected to mixer positive output terminal 232. The drain of NMOS transistor 714 is connected to mixer negative output terminal 234. The gate of NMOS transistor 712 is connected to the gate of NMOS transistor 706. The gate of NMOS transistor 712 is also connected to second mixer resistor 716, as well as second oscillator capacitor 710.

FIG. 8 is a schematic diagram of an SMCC circuit having a common mode voltage control circuit. SMCC circuit 200 of FIG. 8 may be used in the DCR 100 in FIG. 1. In one embodiment, two SMCC circuits 200 having identical properties (noting that there may be some differences due to limitations of the manufacturing process, etc.) are used for SMCC 200a and SMCC 200b in FIG. 1. The current conveyer 110 of FIG. 8 is similar to the current conveyer in FIG. 5, but adds a common mode voltage control circuit 800, which sets a common mode voltage at the current conveyer output terminals 230a, 230b. The common mode voltage control circuit 800 includes a first common mode resistor 804, a second common mode resistor 806, and an operational amplifier 802. The first common mode resistor 804 is connected between current conveyer positive output terminal 230a and one input of the operational amplifier 802. This input could be the non-inverting input of the operational amplifier. The second common mode resistor 806 is connected between current conveyer negative output terminal 230b and the same input of the operational amplifier 802 to which first common mode resistor 804 is connected. The other input of the operational amplifier 802 is provided with a reference voltage (Vref). The magnitude of Vref may be selected to establish the common mode operating voltage at the current conveyer output terminals 230a, 230b. The value for Vref may be about half that of V_bias, for example. The output of the operational amplifier 802 is connected to the gates of first NMOS transistor 312 and second NMOS transistor 314.

Note that although MOSFETs are depicted in FIGS. 3, 4, 5, 6A, 6B, 7 and 8, other types of transistors may be used in the current conveyer 110 and the frequency mixers 106, 108. In one embodiment, BJTs are used instead of MOSFETs. For example, NMOS transistors can be replaced with NPN transistors, and PMOS transistors can be replaced by PNP transistors.

Figure 9:
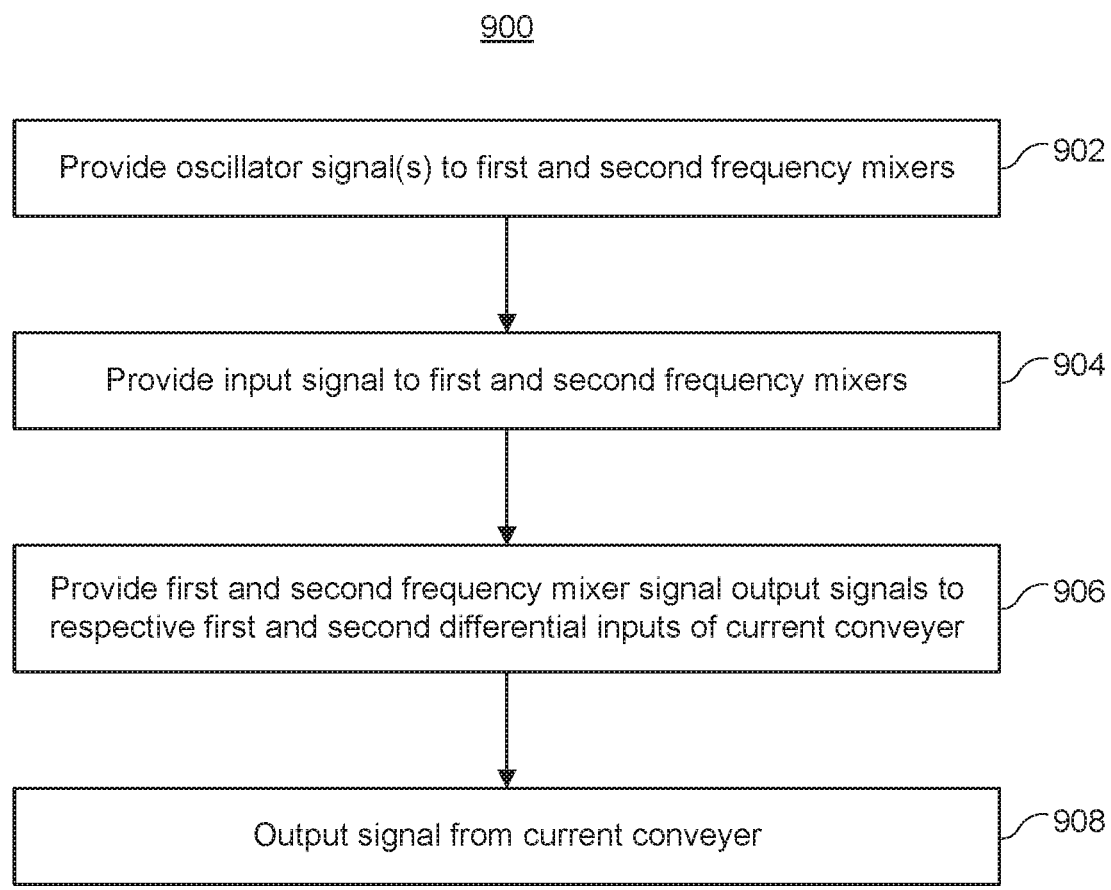
FIG. 9 is a flowchart of one embodiment of a process of operating an SMCC circuit.

FIG. 9 is one embodiment of a process 900 of operating an SMCC circuit. The process 900 may be used to operate any of the SMCC circuits 200 shown in FIG. 1, 2, 3, 4, 5, 6A, 6B or 8.

Step 902 includes providing oscillator signal(s) to a first frequency mixer 106 and to a second frequency mixer 108. The oscillator signal that is provided to the first frequency mixer 106 has the same frequency as the oscillator signal that is provided to the second frequency mixer 108. The oscillator signal that is provided to the first frequency mixer 106 has the same frequency and phase as the oscillator signal that is provided to the second frequency mixer 108. The oscillator signal(s) are provided by local oscillator (FIG. 1, 122) in one embodiment. As one example, the local oscillator 122 outputs an oscillator signal (Osc) which is input into both the first frequency mixer 106 and the second frequency mixer 108.

Step 904 includes providing an input signal to the first frequency mixer 106 and to a second frequency mixer 108. Note that the same input signal is input into both the first frequency mixer 106 and to the second frequency mixer 108. The input signal is an RF signal, in one embodiment. For example, the RF signal might be provided by an amplifier (e.g., LNA 104). More generally, the input signal is provided by an RF signal circuit.

The first frequency mixer 106 and the second frequency mixer 108 are each down-mixers, in one embodiment. Thus, the first frequency mixer 106 and the second frequency mixer 108 each lower the frequency of the input signal by the frequency of the oscillator signal, in one embodiment. Note that the first frequency mixer 106 and the second frequency mixer 108 will each output a signal that has the same frequency.

Step 906 includes providing first and second frequency mixer output signals to respective first and second differential inputs of a current conveyer 110. With respect to any of FIG. 2, 3, 4, 5, 6A, 6B or 8, the first frequency mixer output signal may be input to first differential input of the first stage 202a, which has positive input terminal 204a and negative input terminal 206a. With respect to any of FIG. 2, 3, 4, 5, 6A, 6B or 8, the second frequency mixer output signal may be input to second differential input of the second stage 202b, which has positive input terminal 204b and negative input terminal 206b.

Step 908 includes outputting a signal from the current conveyer 110. With respect to any of FIG. 2, 3, 4, 5, 6A, 6B or 8, the current conveyer output signal may be output from current conveyer output, which comprises current conveyer positive output terminal 230a and current conveyer negative output terminal 230b.

Step 908 may include, operating the first stage 202a and the second stage 202b of the current conveyer 110 in a push-pull mode to generate the output signal from the current conveyer. Step 908 may include operating the first stage 202a and the second stage 202b of the current conveyer 110 as a class AB amplifier.

Figure 10:
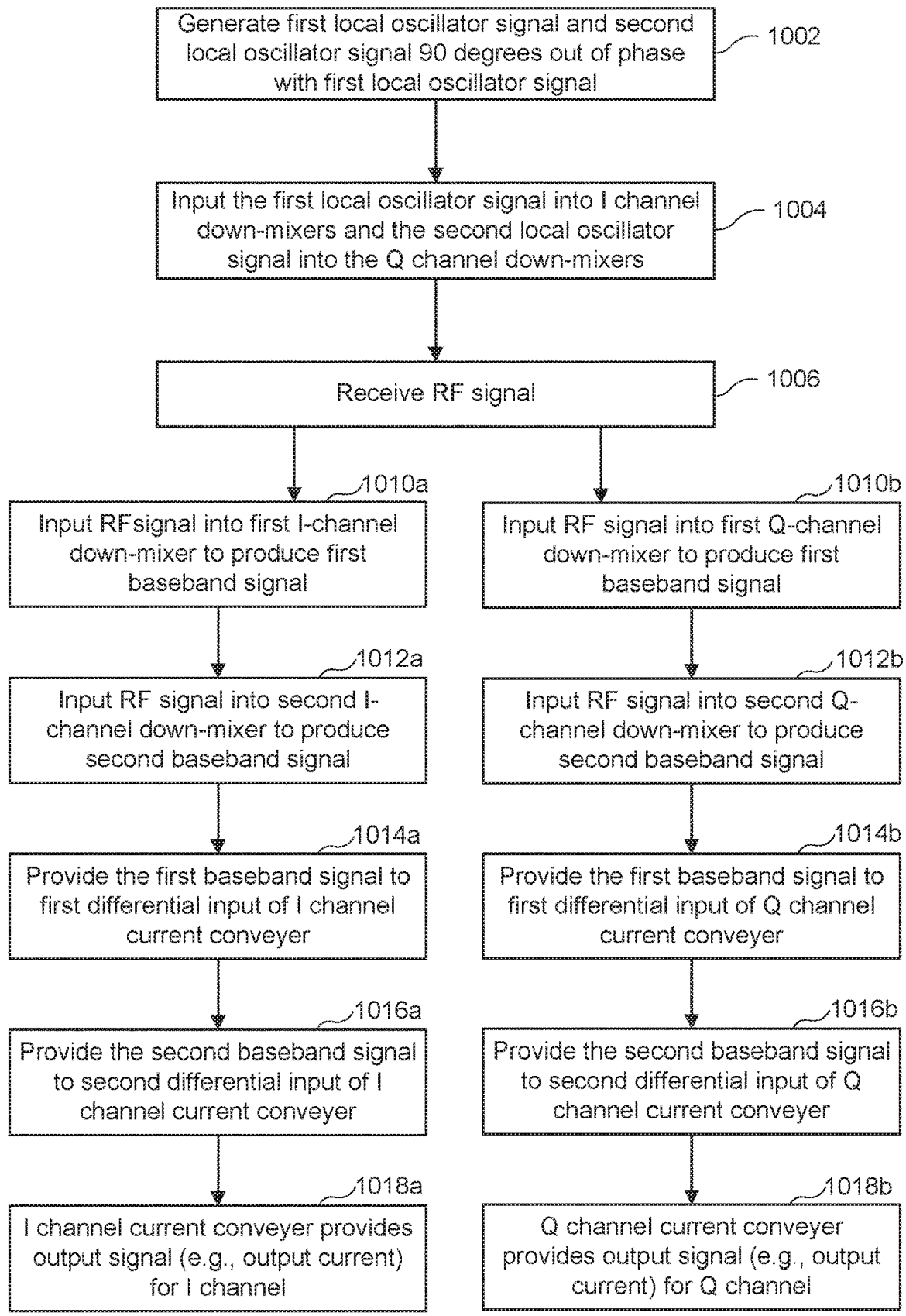
FIG. 10 is a flowchart of one embodiment of a process of operating a current conveyer that is in a DCR.

FIG. 10 is a flowchart of one embodiment of a process 1000 of operating a current conveyer that is in a DCR 100. The process 1000 may be used with DCR 100 depicted in FIG. 1, but is not limited to the DCR 100 of FIG. 1. Note that the steps are described in a certain order for convenience of explanation.

Step 1002 includes generating a first local oscillator signal and a second local oscillator signal that is 90 degrees out of phase with the first local oscillator signal. The local oscillator signals may be generated by local oscillator 122.

Step 1004 includes inputting the first local oscillator signal into I-channel down-mixers and the second local oscillator signal into the Q-channel down-mixers. With respect to the embodiment of FIG. 1, the first local oscillator signal may be input to frequency mixers 106a, 108a; and the second local oscillator signal may be input to frequency mixers 106b, and 108b.

Step 1006 includes receiving an RF signal. With respect to FIG. 1, the RF signal is received by radio frequency (RF) input 102. The RF signal may be input to LNA 104.

First processing of the I component of the RF signal will be discussed. Note that processing of the Q component of the RF signal is similar. Step 1010a includes inputting the RF signal into a first I-channel down-mixer to produce a first baseband signal. For example, the RF signal may be input to frequency mixer 106a, which outputs a first baseband signal corresponding to the I component of the RF signal.

Step 1012a includes inputting the RF signal into a second down-mixer to produce a second baseband signal. For example, the RF signal may be input to frequency mixer 108a, which outputs a second baseband signal also corresponding to the I component of the RF signal. Note that frequency mixer 106a and frequency mixer 108a may each receive the same RF signal.

Step 1014a includes providing the first baseband signal to a first differential input of an I channel current conveyer. With respect to FIG. 1, the first frequency mixer 106a outputs a baseband signal to current conveyer 110a. With respect to any of FIG. 2, 3, 4, 5, 6A, 6B or 8, the first frequency mixer 106 provides its output signal to the first differential input of the first stage 202a, which has positive input terminal 204a and negative input terminal 206a.

Step 1016a includes providing the second baseband signal to a second differential input of an I channel current conveyer. With respect to FIG. 1, the second frequency mixer 108a outputs a baseband signal to current conveyer 110a. With respect to any of FIG. 2, 3, 4, 5, 6A, 6B or 8, the second frequency mixer 108 provides its output signal to the second differential input of the second stage 202b, which has positive input terminal 204b and negative input terminal 206b.

Step 1018a includes the current conveyer providing an output signal (e.g., output current, output voltage) for the I channel. With respect to FIG. 1, current conveyer 110a provides its output signal to channel filter 112a. With respect to any of FIG. 2, 3, 4, 5, 6A, 6B or 8, the current conveyer output signal may be output from current conveyer output, which comprises current conveyer positive output terminal 230a and current conveyer negative output terminal 230b.

Processing of the Q component may be similar to the I component just described. Step 1010b includes inputting the RF signal into a first Q-channel down-mixer to produce a first baseband signal. For example, the RF signal may be input to frequency mixer 106b, which outputs a first baseband signal corresponding to the Q component of the RF signal.

Step 1012b includes inputting the RF signal into a second Q-channel down-mixer to produce a second baseband signal. For example, the RF signal may be input to frequency mixer 108b which outputs a second baseband signal also corresponding to the Q component of the RF signal. Note that frequency mixer 106b and frequency mixer 108b may each receive the same RF signal.

Step 1014b includes providing the first baseband signal to a first differential input of a Q channel current conveyer. With respect to FIG. 1, the first frequency mixer 106b outputs a baseband signal to current conveyer 110b. With respect to any of FIG. 2, 3, 4, 5, 6A, 6B or 8, the first frequency mixer 106 provides its output signal to the first differential input of the first stage 202a, which has positive input terminal 204a and negative input terminal 206a.

Step 1016b includes providing the second baseband signal to a second differential input of a Q channel current conveyer. With respect to FIG. 1, the second frequency mixer 108b outputs a baseband signal to current conveyer 110b. With respect to any of FIG. 2, 3, 4, 5, 6A, 6B or 8, the second frequency mixer 108 provides its output signal to the second differential input of the second stage 202b, which has positive input terminal 204b and negative input terminal 206b.

Step 1018b includes the current conveyer providing an output signal (e.g., output current, output voltage) for the Q channel. With respect to FIG. 1, current conveyer 110b provides its output signal to channel filter 112b. With respect to any of FIG. 2, 3, 4, 5, 6A, 6B or 8, the current conveyer output signal may be output from current conveyer output, which comprises current conveyer positive output terminal 230a and current conveyer negative output terminal 230b.

As noted herein, embodiments of a SMCC circuit 200 can be implemented in a receiver such as, but not limited to, DCR 100 of FIG. 1. One embodiment of an SMCC circuit 200 is implemented in user equipment (UE) that can be configured to transmit and/or receive wireless signals or wired signals. A UE can be any suitable end user device and may include such devices (or may be referred to) as a user equipment/device, wireless transmit/receive unit (UE), mobile station, fixed or mobile subscriber unit, pager, cellular telephone, personal digital assistant (PDA), smartphone, laptop, computer, touchpad, wireless sensor, wearable devices or consumer electronics device.

Figure 11:
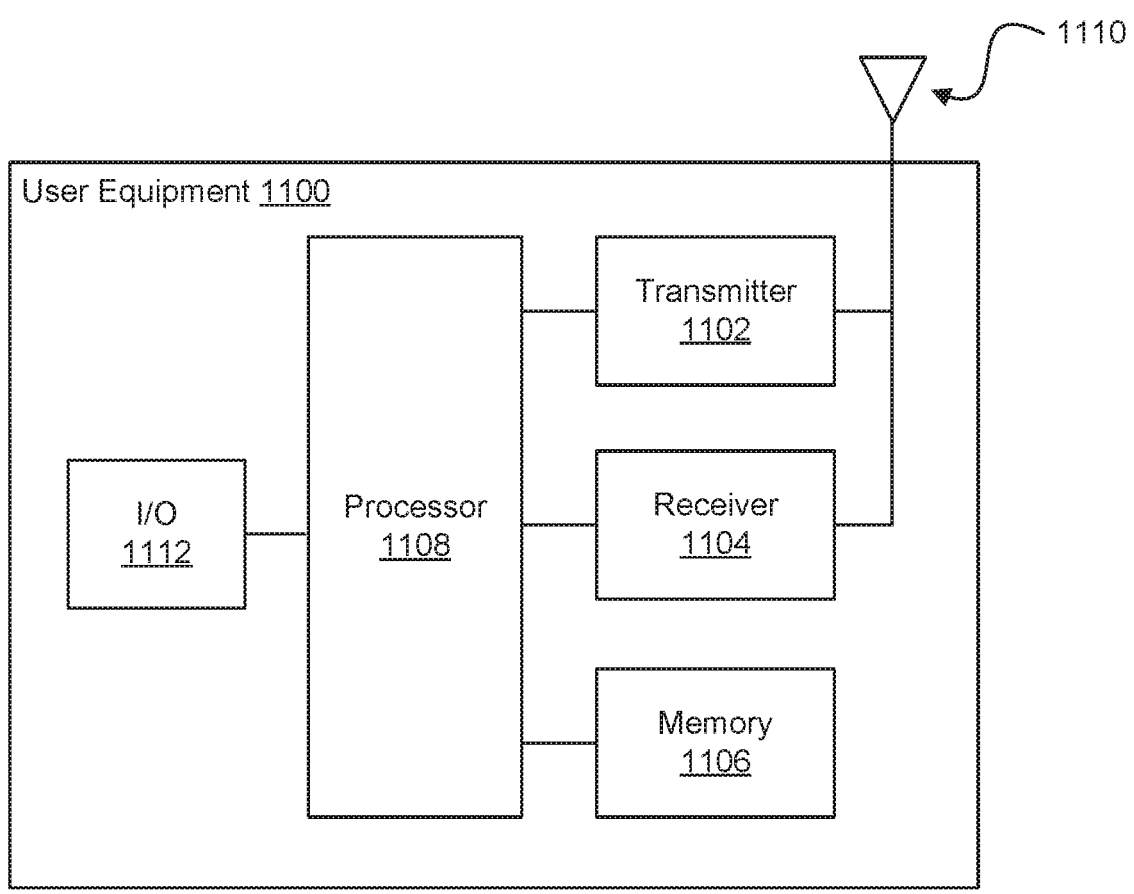
FIG. 11 illustrates example details of User Equipment, which may implement an embodiment of an SMCC circuit.

FIG. 11 illustrates example details of a UE 1100 which may implement an embodiment of an SMCC circuit 200. The UE 1100 may for example be a mobile telephone, but may be other devices in further examples such as a desktop computer, laptop computer, tablet, hand-held computing device, automobile computing device and/or other computing devices. As shown in the figure, the exemplary UE 1100 is shown as including at least one transmitter 1102, at least one receiver 1104, memory 1106, at least one processor 1108, and at least one input/output device 1112. The receiver 1104 contains an SMCC 200, in one embodiment.

The processor 1108 can implement various processing operations of the UE 1100. For example, the processor 1108 can perform signal coding, data processing, power control, input/output processing, or any other functionality enabling the UE 1100 to operate in a communication system (e.g., communication system 1300 in FIG. 13). The processor 1108 may include any suitable processing or computing device configured to perform one or more operations. For example, the processor 1108 may include a microprocessor, microcontroller, digital signal processor, field programmable gate array, or application specific integrated circuit.

The transmitter 1102 can be configured to modulate data or other content for transmission by at least one antenna 1110. The transmitter 1102 can also be configured to amplify, filter and frequency convert RF signals before such signals are provided to the antenna 1110 for transmission. The transmitter 1102 can include any suitable structure for generating signals for wireless transmission.

The receiver 1104 can be configured to demodulate data or other content received by the at least one antenna 1110. The receiver 1104 can also be configured to amplify, filter and frequency convert RF signals received via the antenna 1110. The receiver 1104 can include any suitable structure for processing signals received wirelessly. The antenna 1110 can include any suitable structure for transmitting and/or receiving wireless signals. The same antenna 1110 can be used for both transmitting and receiving RF signals, or alternatively, different antennas 1110 can be used for transmitting signals and receiving signals.

It is appreciated that one or multiple transmitters 1102 could be used in the UE 1100, one or multiple receivers 1104 could be used in the UE 1100, and one or multiple antennas 1110 could be used in the UE 1100. Although shown as separate blocks or components, at least one transmitter 1102 and at least one receiver 1104 could be combined into a transceiver. Accordingly, rather than showing a separate block for the transmitter 1102 and a separate block for the receiver 1104 in FIG. 11, a single block for a transceiver could have been shown.

The UE 1100 further includes one or more input/output devices 1112. The input/output devices 1112 facilitate interaction with a user. Each input/output device 1112 includes any suitable structure for providing information to or receiving information from a user, such as a speaker, microphone, keypad, keyboard, display, or touch screen.

In addition, the UE 1100 includes at least one memory 1106. The memory 1106 stores instructions and data used, generated, or collected by the UE 1100. For example, the memory 1106 could store software or firmware instructions executed by the processor(s) 1108 and data used to reduce or eliminate interference in incoming signals. Each memory 1106 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

One embodiment of an SMCC circuit 200 is implemented in a base station (BS). The base stations may include one or more of several well-known devices, such as a base transceiver station (BTS), a Node-B (NodeB), an evolved NodeB (eNB), a next (fifth) generation (5G) NodeB (gNB), a Home NodeB, a Home eNodeB, a site controller, an access point (AP), or a wireless router, or a server, router, switch, or other processing entity with a wired or wireless network.

Figure 12:
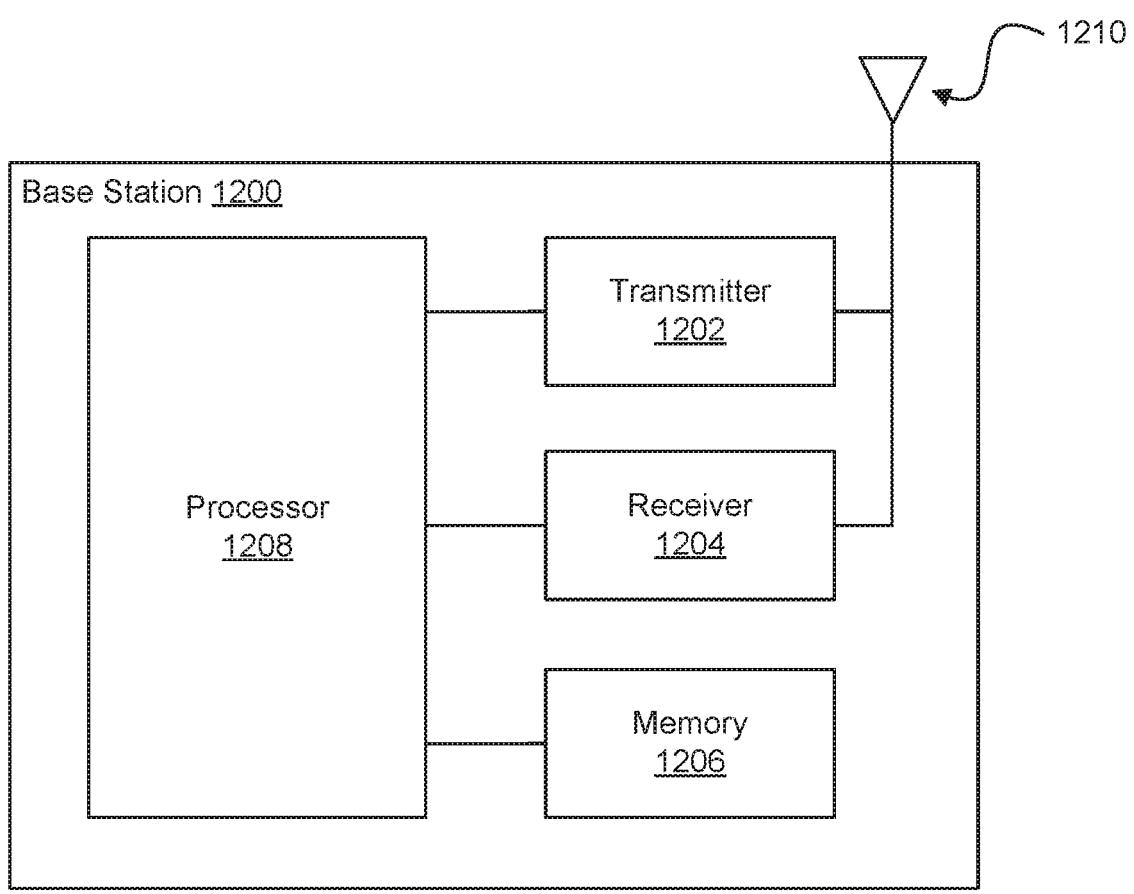
FIG. 12 illustrates an example Base Station that may contain an embodiment of an SMCC circuit.

FIG. 12 illustrates an example BS 1200 that may contain an embodiment of an SMCC circuit 200. As shown in the figure, the BS 1200 includes at least one processor 1208, at least one transmitter 1202, at least one receiver 1204, one or more antennas 1210, and at least one memory 1206. The processor 1208 implements various processing operations of the BS 1200, such as signal coding, data processing, power control, input/output processing, or any other functionality. Each processor 1208 includes any suitable processing or computing device configured to perform one or more operations. Each processor 1208 could, for example, include a microprocessor, microcontroller, digital signal processor, field programmable gate array, or application specific integrated circuit.

Each transmitter 1202 includes any suitable structure for generating signals for wireless transmission to one or more UEs 1100 or other devices. Each receiver 1204 includes any suitable structure for processing signals received wirelessly from one or more UEs 1100 or other devices. The receiver 1204 may include an SMCC circuit 200.

Although shown as separate blocks or components, at least one transmitter 1202 and at least one receiver 1204 could be combined into a transceiver. Each antenna 1210 includes any suitable structure for transmitting and/or receiving wireless signals. While a common antenna 1210 is shown here as being coupled to both the transmitter 1202 and the receiver 1204, one or more antennas 1210 could be coupled to the transmitter(s) 1202, and one or more separate antennas 1210 could be coupled to the receiver(s) 1204. Each memory 1206 includes any suitable volatile and/or non-volatile storage and retrieval device(s).

Figure 13:
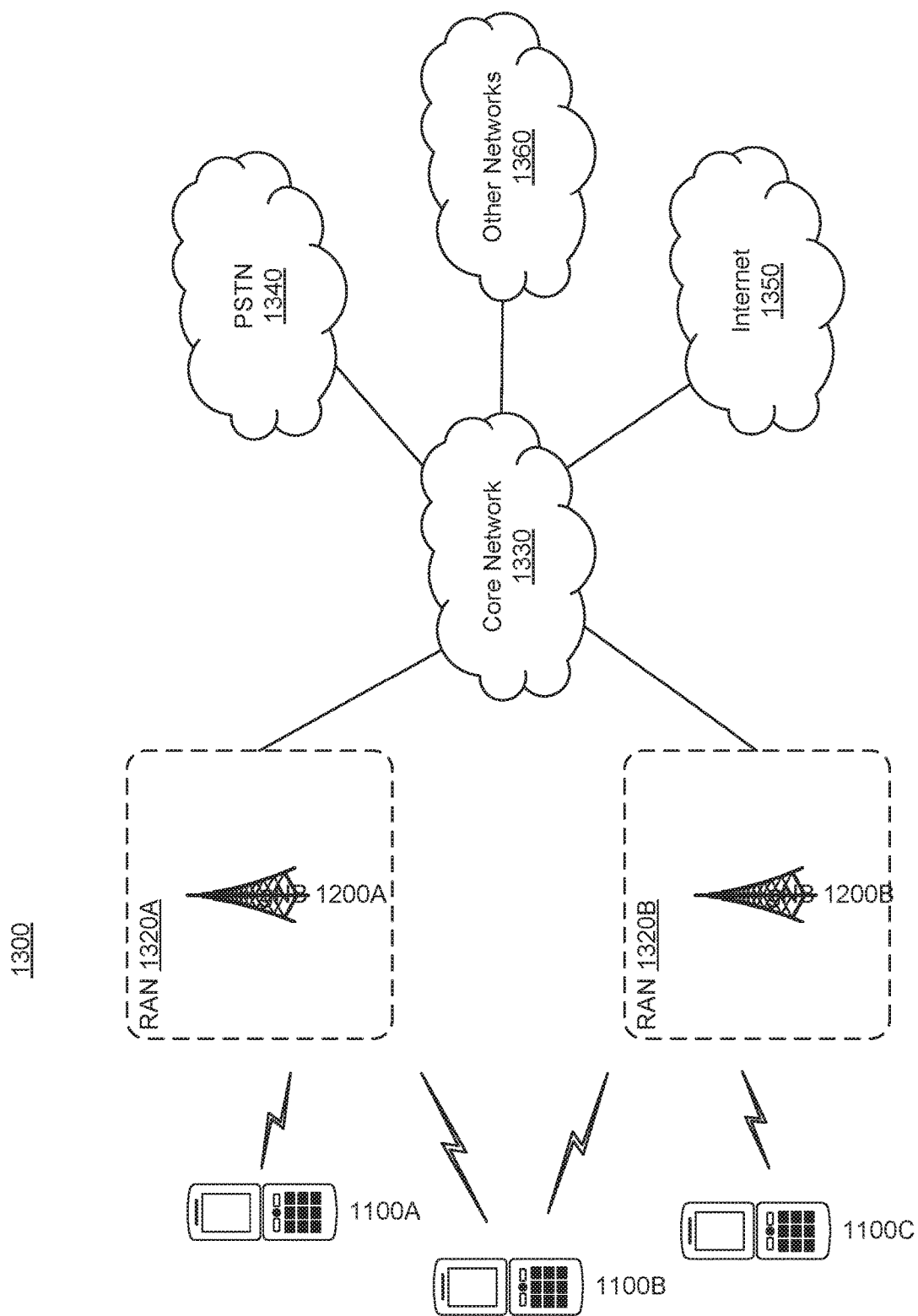
FIG. 13 illustrates a wireless network for communicating data.

The UE 1100 and/or the base stations 1200 may be used in a wireless network for communicating data, such as the communication system 1300 illustrated in FIG. 13. Referring to FIG. 13, the communication system 1300 includes, for example, user equipment 1100A, 1100B, and 1100C, radio access networks (RANs) 1320A and 1320B, a core network 1330, a public switched telephone network (PSTN) 1340, the Internet 1350, and other networks 1360. Additional or alternative networks include private and public data-packet networks including corporate intranets. While certain numbers of these components or elements are shown in the figure, any number of these components or elements may be included in the system 1300.

In one embodiment, the wireless network may be a fifth generation (5G) network including at least one 5G base station which employs orthogonal frequency-division multiplexing (OFDM) and/or non-OFDM and a transmission time interval (TTI) shorter than 1 ms (e.g. 100 or 200 microseconds), to communicate with the communication devices. In general, a base station may also be used to refer to any of the eNB and the 5G BS (gNB). In addition, the network may further include a network server for processing information received from the communication devices via the at least one eNB or gNB.

System 1300 enables multiple wireless users to transmit and receive data and other content. The system 1300 may implement one or more channel access methods, such as but not limited to code division multiple access (CDMA), time division multiple access (TDMA), frequency division multiple access (FDMA), orthogonal FDMA (OFDMA), or single-carrier FDMA (SC-FDMA).

The user equipment (UE) 1100A, 1100B, and 1100C, which can be referred to individually as an UE 1100, or collectively as the UEs 1100, are configured to operate and/or communicate in the system 1300. For example, an UE 1100 can be configured to transmit and/or receive wireless signals or wired signals. Each UE 1100 represents any suitable end user device and may include such devices (or may be referred to) as a user equipment/device, wireless transmit/receive unit (UE), mobile station, fixed or mobile subscriber unit, pager, cellular telephone, personal digital assistant (PDA), smartphone, laptop, computer, touchpad, wireless sensor, wearable devices or consumer electronics device.

In the depicted embodiment, the RANs 1320A, 1320B include one or more base stations (BSs) 1200A, 1200B, respectively. The RANs 1320A and 1320B can be referred to individually as a RAN 1320, or collectively as the RANs 1320. Similarly, the base stations (BSs) 1200A and 1200B can be referred to individually as a base station (BS) 1200, or collectively as the base stations (BSs) 1200. Each of the BSs 1200 is configured to wirelessly interface with one or more of the UEs 1100 to enable access to the core network 1330, the PSTN 1340, the Internet 1350, and/or the other networks 1360. For example, the base stations (BSs) 1200 may include one or more of several well-known devices, such as a base transceiver station (BTS), a Node-B (NodeB), an evolved NodeB (eNB), a next (fifth) generation (5G) NodeB (gNB), a Home NodeB, a Home eNodeB, a site controller, an access point (AP), or a wireless router, or a server, router, switch, or other processing entity with a wired or wireless network.

In one embodiment, the BS 1200A forms part of the RAN 1320A, which may include one or more other BSs 1200, elements, and/or devices. Similarly, the BS 1200B forms part of the RAN 1320B, which may include one or more other BSs 1200, elements, and/or devices. Each of the BSs 1200 operates to transmit and/or receive wireless signals within a particular geographic region or area, sometimes referred to as a "cell." In some embodiments, multiple-input multiple-output (MIMO) technology may be employed having multiple transceivers for each cell.

The BSs 1200 communicate with one or more of the UEs 1100 over one or more air interfaces (not shown) using wireless communication links. The air interfaces may utilize any suitable radio access technology.

It is contemplated that the system 1300 may use multiple channel access functionality, including for example schemes in which the BSs 1200 and UEs 1100 are configured to implement the Long Term Evolution wireless communication standard (LTE), LTE Advanced (LTE-A), and/or LTE Multimedia Broadcast Multicast Service (MBMS). In other embodiments, the base stations 1200 and user equipment 1100A-1100C are configured to implement UMTS, HSPA, or HSPA+ standards and protocols. Of course, other multiple access schemes and wireless protocols may be utilized.

The RANs 1320 are in communication with the core network 1330 to provide the UEs 1100 with voice, data, application, Voice over Internet Protocol (VoIP), or other services. As appreciated, the RANs 1320 and/or the core network 1330 may be in direct or indirect communication with one or more other RANs (not shown). The core network 1330 may also serve as a gateway access for other networks (such as PSTN 1340, Internet 1350, and other networks 1360). In addition, some or all of the UEs 1100 may include functionality for communicating with different wireless networks over different wireless links using different wireless technologies and/or protocols.

The RANs 1320 may also include millimeter and/or microwave access points (APs). The APs may be part of the BSs 1200 or may be located remote from the BSs 1200. The APs may include, but are not limited to, a connection point (an mmW CP) or a BS 1200 capable of mmW communication (e.g., a mmW base station). The mmW APs may transmit and receive signals in a frequency range, for example, from 24 GHz to 100 GHz, but are not required to operate throughout this range. As used herein, the term base station is used to refer to a base station and/or a wireless access point.

Although FIG. 13 illustrates one example of a communication system, various changes may be made to FIG. 13. For example, the communication system 1300 could include any number of user equipment, base stations, networks, or other components in any suitable configuration. It is also appreciated that the term user equipment may refer to any type of wireless device communicating with a radio network node in a cellular or mobile communication system. Non-limiting examples of user equipment are a target device, device-to-device (D2D) user equipment, machine type user equipment or user equipment capable of machine-to-machine (M2M) communication, laptops, PDA, iPad, Tablet, mobile terminals, smart phones, laptop embedded equipped (LEE), laptop mounted equipment (LME) and USB dongles.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

It is understood that the present subject matter may be embodied in many different forms and should not be construed as being limited to the embodiments set forth herein. Rather, these embodiments are provided so that this subject matter will be thorough and complete and will fully convey the disclosure to those skilled in the art. Indeed, the subject matter is intended to cover alternatives, modifications and equivalents of these embodiments, which are included within the scope and spirit of the subject matter as defined by the appended claims. Furthermore, in the following detailed description of the present subject matter, numerous specific details are set forth in order to provide a thorough understanding of the present subject matter. However, it will be clear to those of ordinary skill in the art that the present subject matter may be practiced without such specific details.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
a current conveyer comprising a first stage having a first differential input, a second stage having a second differential input, and a current conveyer output between the first stage and the second stage, the first stage and the second stage configured to operate in a push-pull mode to provide an output signal at the current conveyer output;
a first frequency mixer coupled to the current conveyer, the first frequency mixer configured to generate a first mixer signal based on an input signal and a first oscillator signal having a first frequency, the first frequency mixer configured to provide the first mixer signal to the first differential input; and
a second frequency mixer coupled to the current conveyer, the second frequency mixer configured to generate a second mixer signal based on the input signal and a second oscillator signal also having the first frequency, the second frequency mixer configured to provide the second mixer signal to the second differential input.

2. The apparatus of claim 1, wherein:
the first stage comprises a first common gate/base differential amplifier comprising the first differential input and a first differential output connected to the current conveyer output; and
the second stage comprises a second common gate/base differential amplifier comprising the second differential input and a second differential output connected to the current conveyer output.

3. The apparatus of claim 2, wherein:
the first common gate/base differential amplifier comprises a pair of PMOS transistors each having a gate and a source, the pair of PMOS transistors having their gates connected together; and
the second common gate/base differential amplifier comprises a pair of NMOS transistors each having a gate and a source, the pair of NMOS transistors having their gates connected together.

4. The apparatus of claim 3, wherein:
the source of a first member of the pair of PMOS transistors is a positive input of the first differential input;
the source of a second member of the pair of PMOS transistors is a negative input of the first differential input;
the source of a first member of the pair of NMOS transistors is a positive input of the second differential input; and
the source of a second member of the pair of NMOS transistors is a negative input of the second differential input.

5. The apparatus of claim 2, wherein:
the first common gate/base differential amplifier comprises a pair of PNP transistors each having a base, with the pair of PNP transistors having their bases connected together; and
the second common gate/base differential amplifier comprises a pair of NPN transistors each having a base, with the pair of NPN transistors having their bases connected together.

6. The apparatus of claim 2, further comprising:
a common mode voltage control circuit coupled to the current conveyer output and to the first common gate/base differential amplifier, wherein the common mode voltage control circuit is configured to control a common mode voltage at the current conveyer output.

7. The apparatus of claim 1, wherein:
the first frequency mixer is a first down-mixer; and
the second frequency mixer a second down-mixer.

8. The apparatus of claim 7, wherein the first frequency mixer comprises a first input terminal and a second input terminal, wherein the second frequency mixer comprises a third input terminal and a fourth input terminal, and further comprising:
a first signal coupling capacitor connected to the first input terminal;
a second signal coupling capacitor connected to the second input terminal, the first and second signal coupling capacitors being configured to couple the input signal to the first frequency mixer;
a third signal coupling capacitor connected to the third input terminal; and
a fourth signal coupling capacitor connected to the fourth input terminal, the third and fourth signal coupling capacitors being configured to couple the input signal to the second frequency mixer.

9. The apparatus of claim 1, wherein the first stage and the second stage form a class AB amplifier.

10. The apparatus of claim 1, further comprising:
a component configured to provide the input signal to the first frequency mixer and to the second frequency mixer, the input signal being a radio frequency (RF) signal; and
a low pass filter coupled to the current conveyer output, the current conveyer configured to provide the output signal to the low pass filter.

11. The apparatus of claim 1, wherein the first oscillator signal and the second oscillator signal have the same phase.

12. A method of processing an input signal, the method comprising:
providing a first oscillator signal having a first frequency to a first frequency mixer;
providing a second oscillator signal having a second frequency to a second frequency mixer, the second frequency being the same frequency as the first frequency;
generating a first mixer output signal based on the input signal and the first oscillator signal;
generating a second mixer output signal based on the input signal and the second oscillator signal;
providing the first mixer output signal to a first differential input of a first stage of a current conveyer;
providing the second mixer output signal to a second differential input of a second stage of the current conveyer; and
operating the first stage and the second stage of the current conveyer in a push-pull mode to generate an output signal from a current conveyer output of the current conveyer.

13. The method of claim 12, wherein operating the first stage and the second stage of the current conveyer in the push-pull mode to generate the output signal from the current conveyer comprises:
operating the first stage and the second stage as a class AB amplifier.

14. The method of claim 12, wherein operating the first stage and the second stage of the current conveyer in the push-pull mode to generate the output signal from the current conveyer comprises:
the first stage providing a first current to the current conveyer output for more than 180 degrees but less than 360 degrees of the output signal; and
the second stage sinking a second current from the current conveyer output for more than 180 degrees but less than 360 degrees of the output signal.

15. The method of claim 12, wherein:
generating the first mixer output signal based on the input signal and the first oscillator signal comprises generating a first baseband signal based on a radio frequency (RF) signal; and
generating the second mixer output signal based on the input signal and the second oscillator signal comprises generating a second baseband signal based on the radio frequency (RF) signal.

16. A radio frequency (RF) receiver, comprising:
a first frequency mixer;
a second frequency mixer;
a current conveyer comprising: a first stage having a first differential input, a second stage having a second differential input, and a current conveyer output; and
circuitry configured to:
provide a first oscillator signal having a first frequency to the first frequency mixer;
provide a second oscillator signal having a second frequency to the second frequency mixer, the second frequency being the same frequency as the first frequency;
generate a first mixer output signal based on an input signal and the first oscillator signal;
generate a second mixer output signal based on the input signal and the second oscillator signal;
provide the first mixer output signal to the first differential input of the first stage of the current conveyer;
provide the second mixer output signal to the second differential input of the second stage of the current conveyer; and
operate the first stage and the second stage of the current conveyer in a push-pull mode to generate an output signal from the current conveyer output of the current conveyer.

17. The radio frequency (RF) receiver of claim 16, wherein the circuitry configured to operate the first stage and the second stage of the current conveyer in a push-pull mode comprises circuitry configured to operate the first stage and the second stage as a class AB amplifier.

18. The radio frequency (RF) receiver of claim 16, wherein:
the circuitry configured to generate the first mixer output signal based on the input signal and the first oscillator signal comprises circuitry configured to generate a first baseband signal based on a radio frequency (RF) signal; and
the circuitry configured to generate the second mixer output signal based on the input signal and the second oscillator signal comprises circuitry configured to generate a second baseband signal based on the radio frequency (RF) signal.

19. The radio frequency (RF) receiver of claim 16, wherein:
the first frequency mixer comprises a first down-mixer; and
the second frequency mixer comprises a second down-mixer.

20. The radio frequency (RF) receiver of claim 16, wherein the first oscillator signal and the second oscillator signal have the same phase.

* * * * *